United States Patent
Kang et al.

(10) Patent No.: US 9,745,658 B2
(45) Date of Patent: Aug. 29, 2017

(54) CHAMBER UNDERCOAT PREPARATION METHOD FOR LOW TEMPERATURE ALD FILMS

(71) Applicant: Lam Research Corporation, Fremont, CA (US)

(72) Inventors: Hu Kang, Tualatin, OR (US); Jun Qian, Tualatin, OR (US); Adrien LaVoie, Newberg, OR (US)

(73) Assignee: LAM RESEARCH CORPORATION, Fremont, CA (US)

( * ) Notice: Subject to any disclaimer, the term of this patent is extended or adjusted under 35 U.S.C. 154(b) by 300 days.

(21) Appl. No.: 14/089,653

(22) Filed: Nov. 25, 2013

(65) Prior Publication Data

US 2015/0147482 A1     May 28, 2015

(51) Int. Cl.
| | |
|---|---|
| C23C 16/455 | (2006.01) |
| C23C 16/56 | (2006.01) |
| C23C 16/44 | (2006.01) |

(52) U.S. Cl.
CPC .... C23C 16/45525 (2013.01); C23C 16/4404 (2013.01)

(58) Field of Classification Search
CPC .............. C23C 16/56; C23C 16/45525; C23C 16/45529; C23C 16/45536; C23C 16/50; C23C 16/30; C23C 16/40
See application file for complete search history.

(56) References Cited

U.S. PATENT DOCUMENTS

| | | |
|---|---|---|
| 4,892,753 A | 1/1990 | Wang et al. |
| 5,605,859 A | 2/1997 | Lee |
| 5,647,953 A | 7/1997 | Williams et al. |
| 5,654,475 A | 8/1997 | Vassiliou et al. |
| 5,824,375 A | 10/1998 | Gupta |

(Continued)

FOREIGN PATENT DOCUMENTS

CN     103243310 A     8/2013

OTHER PUBLICATIONS

Nakagawa, Takahide, "Effect of Coating on the Plasma Chamber Wall in RIKEN Electron Cyclotron Resonance Ion Source". Japanese Journal of Applied Physics, vol. 30, No. 5B, May 1991, pp. L930-:932.*

(Continued)

Primary Examiner — Bret Chen
(74) Attorney, Agent, or Firm — Weaver Austin Villeneuve & Sampson LLP

(57) ABSTRACT

Methods and apparatus disclosed herein relate to the formation and use of undercoats on the interior surfaces of reaction chambers used to deposit films on substrates. The undercoats are deposited through atomic layer deposition methods. For example, the undercoat may be formed by flowing a first reactant into the reaction chamber, flowing a second reactant into the reaction chamber while the first reactant is adsorbed on interior surfaces of the reaction chamber, and exposing the reaction chamber to plasma to form the undercoat. The disclosed undercoats help prevent metal contamination, provide improved resistance to flaking, and are relatively thin. Because of the superior resistance to flaking, the disclosed undercoats allow more substrates to be processed between subsequent cleaning operations, thereby increasing throughput.

16 Claims, 9 Drawing Sheets

(56) References Cited

U.S. PATENT DOCUMENTS

| | | | |
|---|---|---|---|
| 5,970,383 A | 10/1999 | Lee | |
| 6,071,573 A | 6/2000 | Koemtzopoulos et al. | |
| 6,121,161 A | 9/2000 | Rossman et al. | |
| 6,121,164 A | 9/2000 | Yieh et al. | |
| 6,416,577 B1 | 7/2002 | Suntoloa et al. | |
| 6,449,521 B1 | 9/2002 | Gupta | |
| 6,626,188 B2 | 9/2003 | Fitzsimmons et al. | |
| 6,749,098 B2 | 6/2004 | Roier et al. | |
| 6,815,007 B1 | 11/2004 | Yoo et al. | |
| 6,819,969 B2 | 11/2004 | Lee et al. | |
| 7,118,779 B2 | 10/2006 | Verghese et al. | |
| 7,204,913 B1 | 4/2007 | Singh et al. | |
| 7,232,492 B2 | 6/2007 | Won et al. | |
| 7,241,690 B2 | 7/2007 | Pavone et al. | |
| 7,288,284 B2 | 10/2007 | Li et al. | |
| 7,601,639 B2 | 10/2009 | Pavone et al. | |
| 7,704,894 B1 | 4/2010 | Henri et al. | |
| 7,767,584 B1 | 8/2010 | Singh et al. | |
| 7,799,135 B2 | 9/2010 | Verghese et al. | |
| 7,914,847 B2 | 3/2011 | Verghese et al. | |
| 7,923,376 B1 | 4/2011 | Dhas et al. | |
| 8,017,527 B1 | 9/2011 | Dhas et al. | |
| 8,101,531 B1 | 1/2012 | Li et al. | |
| 8,163,087 B2 | 4/2012 | Faguet et al. | |
| 8,293,658 B2 | 10/2012 | Shero et al. | |
| 9,228,259 B2 | 1/2016 | Haukka et al. | |
| 9,328,416 B2 | 5/2016 | Dhas et al. | |
| 2001/0006835 A1* | 7/2001 | Kim | C23C 8/02 438/250 |
| 2002/0073922 A1 | 6/2002 | Frankel et al. | |
| 2003/0013314 A1 | 1/2003 | Ying et al. | |
| 2004/0023516 A1* | 2/2004 | Londergan | C23C 16/4404 438/785 |
| 2004/0134427 A1 | 7/2004 | Derderian et al. | |
| 2005/0130427 A1 | 6/2005 | Won et al. | |
| 2005/0214455 A1 | 9/2005 | Li et al. | |
| 2005/0221020 A1 | 10/2005 | Fukiage | |
| 2006/0046470 A1 | 3/2006 | Becknell et al. | |
| 2006/0093756 A1* | 5/2006 | Rajagopalan | C23C 16/4404 427/569 |
| 2006/0189171 A1* | 8/2006 | Chua | C23C 16/4404 438/800 |
| 2006/0280868 A1 | 12/2006 | Kato et al. | |
| 2007/0201016 A1 | 8/2007 | Song et al. | |
| 2008/0094775 A1* | 4/2008 | Sneh | H01G 4/10 361/275.3 |
| 2008/0118663 A1 | 5/2008 | Choi et al. | |
| 2008/0302281 A1 | 12/2008 | Bernard et al. | |
| 2009/0197401 A1 | 8/2009 | Li et al. | |
| 2009/0242511 A1 | 10/2009 | Shimazu et al. | |
| 2009/0278116 A1 | 11/2009 | Yamate | |
| 2009/0325391 A1 | 12/2009 | De Vusser et al. | |
| 2010/0048028 A1 | 2/2010 | Rasheed et al. | |
| 2011/0070380 A1* | 3/2011 | Shero | C01B 13/11 427/569 |
| 2011/0151142 A1 | 6/2011 | Seamons et al. | |
| 2011/0256726 A1 | 10/2011 | LaVoie et al. | |
| 2011/0315186 A1* | 12/2011 | Gee | H01L 31/1804 136/244 |
| 2012/0097330 A1 | 4/2012 | Iyengar et al. | |
| 2013/0064973 A1 | 3/2013 | Chen et al. | |
| 2013/0089988 A1 | 4/2013 | Wang et al. | |
| 2014/0120738 A1 | 5/2014 | Jung et al. | |
| 2014/0295670 A1* | 10/2014 | Shih | H01L 21/3065 438/710 |
| 2015/0147482 A1 | 5/2015 | Kang et al. | |
| 2015/0203967 A1 | 7/2015 | Dhas et al. | |
| 2015/0221553 A1 | 8/2015 | Ouye | |
| 2016/0281230 A1 | 9/2016 | Varadarajan et al. | |
| 2016/0300713 A1 | 10/2016 | Cui et al. | |

OTHER PUBLICATIONS

Klimecky, Pete I., et al., "Compensation for transient chamber wall condition using real-time plasma density feedback control in an inductively coupled plasma etcher". J. Vac. Sci. Technol. A 21(3), May/Jun. 2003, pp. 706-717.*

Kim, Jung Geun, et al., "Investigation of Plasma Enhanced Chemical Vapor Deposition Chamber Mismatching by Photoluminescence and Raman Spectroscopy". ECS Journal of Solid State Science and Technology, 4 (8) P314-P318 (2015).*

U.S. Appl. No. 14/712,167, filed May 14, 2015, entitled "Minimizing Radical Recombination Using ALD Silicon Oxide Surface Coating with Intermittent Restoration Plasma."

U.S. Appl. No. 14/683,022, filed Apr. 9, 2015 entitled "Eliminating First Wafer Metal Contamination Effect in High Density Plasma Chemical Vapor Deposition Systems."

US Office Action, dated Aug. 17, 2015, issued in U.S. Appl. No. 14/158,536.

Juárez, H., et al., (2009) "Low temperature deposition: properties of $SiO_2$ films from TEOS and ozone by APCVD system," XIX Latin American Symposium on Solid State Physics (SLAFES XIX). Journal of Physics: Conference Series 167(012020) pp. 1-6.

Kim et al. (1991) "Recombination of O, N, and H Atoms on Silica: Kinetics and Mechanism," Langmuir. 7(12):2999-3005.

Knoops et al.(2010) "Conformality of Plasma-Assisted ALD: Physical Processes and Modeling," Journal of The Electrochemical Society, 157(12):G241-G249.

US Notice of Allowance, dated Jan. 11, 2016, issued in U.S. Appl. No. 14/158,536.

U.S. Office Action, dated Nov. 18, 2016, issued in U.S. Appl. No. 14/712,167.

U.S. Final Office Action, dated Apr. 20, 2017, issued in U.S. Appl. No. 14/712,167.

U.S. Office Action, dated Mar. 24, 2017, issued in U.S. Appl. No. 14/683,022.

Chinese First Office Action, dated Sep. 5, 2016, issued in Application No. CN 201410686823.4.

Cunge et al. (2005) "New chamber walls conditioning and cleaning strategies to improve the stability of plasma processes," Plasma Sources Sci. Technol. 14:509-609.

Cunge et al. (2005) "Plasma-wall interactions during silicon etching processes in high-density $HBr/Cl_2/O_2$ plasmas," Plasma Sources Sci. Technol. 14:S42-S52.

Kang et al. (Jul./Aug. 2005) "Evaluation of silicon oxide cleaning using $F_2$/Ar remote plasma processing," J. Vac. Sci. Technol. A 23(4):911-916.

U.S. Appl. No. 15/384,175, filed Dec. 19, 2016, Wang et al.

Chinese Second Office Action, dated May 8, 2017, issued in Application No. CN 201410686823.4.

U.S. Appl. No. 15/650,731, filed Jul. 14, 2017, Kang et al.

* cited by examiner

| | | | A | B | C | D |
|---|---|---|---|---|---|---|
| | | Method Detection Limits | 250A ALDOx with clean chamber | 250A ALDOx with 1kA ALD UCT | 250A ALDOx with 2kA ALD UCT | 250A ALDOx with 150sec 1um USG UCT |
| 1 | Aluminum (Al) | 0.1 | 0.24 | <0.1 | <0.1 | <0.1 |
| 2 | Calcium (Ca) | 0.1 | <0.1 | <0.1 | <0.1 | <0.1 |
| 3 | Chromium (Cr) | 0.03 | <0.03 | <0.03 | <0.03 | <0.03 |
| 4 | Copper (Cu) | 0.01 | 0.11 | 0.042 | 0.035 | 0.032 |
| 5 | Iron (Fe) | 0.05 | 0.13 | <0.05 | <0.05 | <0.05 |
| 6 | Magnesium (Mg) | 0.05 | <0.05 | <0.05 | <0.05 | <0.05 |
| 7 | Nickel (Ni) | 0.03 | <0.03 | 0.039 | <0.03 | <0.03 |
| 8 | Potassium (K) | 0.1 | <0.1 | <0.1 | <0.1 | <0.1 |
| 9 | Sodium (Na) | 0.1 | <0.1 | <0.1 | 0.12 | <0.1 |
| 10 | Titanium (Ti) | 0.03 | <0.03 | 0.11 | <0.03 | <0.03 |
| 11 | Zinc (Zn) | 0.03 | <0.03 | <0.03 | <0.03 | <0.03 |

SURFACE CONCENTRATION ( x $10^{10}$ atoms/cm$^2$)
Wafer Size = 12 inch

FIG. 7

| 250A process A ALD OX film particle map-to-map adders | | | | | |
|---|---|---|---|---|---|
| Undercoat | >0.05um | >0.08um | >0.09um | >0.1um | >0.2um |
| 2kA ALD OX | 34 | 28 | 23 | 13 | 8 |
| 1um USG | 12 | 10 | 8 | 8 | 8 |

FIG. 8

| Process | Particle map-to-map adders | | | | | |
|---|---|---|---|---|---|---|
| | >0.04 um | >0.06 um | >0.06 um | >0.08 um | >0.1 um | >0.2 um |
| 50°C Process A | 61 | 8 | 8 | 7 | 7 | 4 |
| 50°C Process B | 34 | 4 | 4 | 4 | 4 | 4 |
FIG. 9
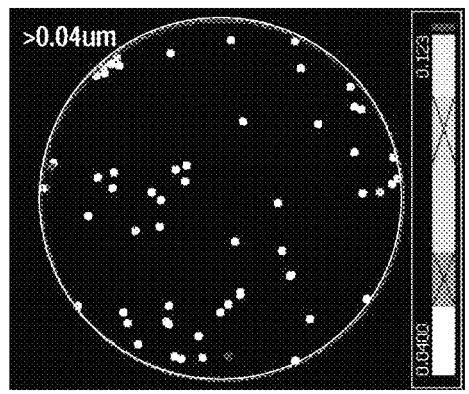
FIG. 10A
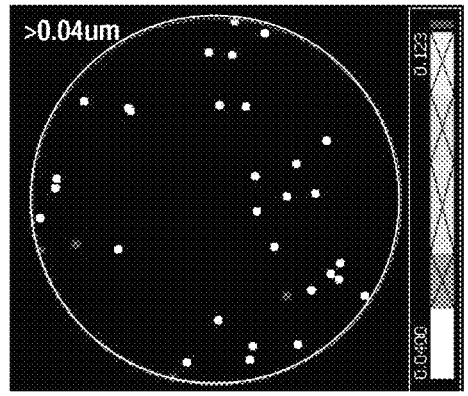
FIG. 10B
| Wafer count | Process | Thickness (A) | Range (A) | NU% (1-sigma) | Range% (half range) |
|---|---|---|---|---|---|
| 1 | 50C ALD Ox | 264.0 | 2.5 | 0.29 | 0.47 |
| 2 | 50C ALD Ox | 263.2 | 2.4 | 0.30 | 0.46 |
| 5 | 50C ALD Ox | 263.2 | 2.1 | 0.25 | 0.40 |
| 10 | 50C ALD Ox | 263.4 | 2.0 | 0.24 | 0.38 |
| 12 | 50C ALD Ox | 263.3 | 2.0 | 0.25 | 0.39 |
| 15 | 50C ALD Ox | 263.4 | 1.8 | 0.23 | 0.35 |
| 20 | 50C ALD Ox | 263.5 | 1.9 | 0.23 | 0.36 |
| 24 | 50C ALD Ox | 263.3 | 1.9 | 0.24 | 0.35 |
| 25 | 50C ALD Ox | 263.6 | 2.0 | 0.25 | 0.38 |
| WtW NU% (half range) | | 0.16 | | | |
FIG. 11

| Undercoat | 50C process A 250A | | | |
|---|---|---|---|---|
| | chamber total accumulation limit | Dummy loops after undercoat | wafers processed in one clean cycle | Throughput (WPH) |
| 2um USG | 3.7um | 20 | 250 | 47 |
| 2kA ALD OX | 5um | 0 | 770 | 54.6 |

CHAMBER UNDERCOAT PREPARATION METHOD FOR LOW TEMPERATURE ALD FILMS

BACKGROUND

As the semiconductor industry advances, device dimensions are becoming increasingly smaller. These progressively smaller features require deposition procedures that are extremely uniform, as the presence of film impurities or other non-uniformities can often lead to the failure of a semiconductor device. An undercoat can help improve wafer-to-wafer thickness uniformity and within-wafer thickness uniformity.

SUMMARY

Certain embodiments herein relate to methods and apparatus for forming an undercoat in a reaction chamber used to deposit films on substrates. In one aspect of the embodiments herein, a method is provided for forming an undercoat on interior surfaces of a reaction chamber for processing substrates, including (a) introducing a flow of a first reactant in vapor phase into the reaction chamber and allowing the first reactant to adsorb onto the interior surfaces of the reaction chamber; (b) introducing a flow of a second reactant in vapor phase into the reaction chamber while the first reactant is adsorbed on the interior surfaces of the reaction chamber; and (c) exposing the reaction chamber to plasma when the flow of at least one of the first and second reactants has ceased, in order to drive a reaction between the first and second reactants on the interior surfaces of the reaction chamber to form the undercoat, where the undercoat conformally coats the interior surfaces of the reaction chamber; where operations (a)-(c) occur when there is no substrate present in the reaction chamber, and where operations (a)-(c) are repeated until the undercoat is at least about 0.1 μm thick.

In some embodiments, a temperature in the reaction chamber does not vary by more than about 2° C. during operations (a)-(c). The undercoat may be an oxide, nitride, carbide, or carbonitride in some cases. The undercoat may also be a noble metal, a lanthanide oxide, a group 4 metal oxide or a group 5 metal oxide. Various different reactants may be used. In some cases, the second reactant includes $O_2$ and $N_2O$. The $O_2$ and $N_2O$ may be provided at substantially equal flow rates, as measured in SLM. The undercoat may conformally coat various interior chamber surfaces, for example a substrate carrier. In some embodiments, the undercoat is no more than about 0.5 or 0.2 μm thick.

The method may continue by (d) receiving a substrate in the reaction chamber; (e) introducing a flow of a third reactant in vapor phase into the reaction chamber and allowing the third reactant to adsorb onto the surface of the substrate; (f) introducing a flow of a fourth reactant in vapor phase into the reaction chamber while the third reactant is adsorbed on the surface of the substrate; and (g) exposing the reaction chamber to plasma when the flow of at least one of the third and fourth reactants has ceased, in order to drive a reaction between the third and fourth reactants to form a second film on the surface of the substrate.

In some implementations, the first reactant and second reactant are the same as the third reactant and fourth reactant, respectively. For example, the second and fourth reactants may each comprise $O_2$ and $N_2O$. Other process characteristics may remain constant between the undercoat deposition and the deposition on substrates. In some embodiments, one or more of the reaction chamber pressure, reaction chamber temperature, dosing durations, plasma exposure durations, and RF power values remain substantially constant between operations (a)-(c) and operations (e)-(g). In certain cases, all of these process characteristics remain constant between the two sets of operations.

In certain embodiments, the temperature in the reaction chamber does not vary by more than about 2° C. during operations (a)-(g). Further, operation (e) may begin within about 5 minutes after a last iteration of operation (c), in some cases. In these or other cases, the reaction chamber may not be purged between a last iteration of operation (c) and a first iteration of operation (e). Operations (d)-(g) may be repeated with a plurality of substrates. In some embodiments, film deposited in operations (a)-(g) does not begin to flake or peel off until a chamber accumulation limit of about 4 μm is reached and/or until at least about 300 substrates have been processed through the reaction chamber using operations (d)-(g). In some cases these limits may be higher, for example flaking/peeling may not begin until at least about 400, or at least about 500, or at least about 600 substrates have been processed. In various embodiments, this may correspond to a total deposition on substrates of at least about 7.5 μm, or at least about 10 μm, or at least about 15 μm before flaking/peeling. This measurement relates to the number of substrates processed between cleaning operations multiplied by the average thickness of film deposited on the substrates.

In another aspect of the disclosed embodiments, a method of treating a reaction chamber for depositing films on substrates is provided, including (a) removing previously deposited film from interior surfaces of the reaction chamber to clean the reaction chamber; and (b) depositing an undercoat on the cleaned interior surfaces of the reaction chamber by an atomic layer deposition process; where operation (b) occurs when there is no substrate present in the reaction chamber. In some embodiments, the undercoat is deposited to a thickness between about 0.1-0.5 μm. Operation (b) may occur isothermally in some embodiments.

In a further aspect of the disclosed embodiments, a reaction chamber ready for depositing films on substrates is provided, including: one or more inlets for introducing vapor phase reactants to the reaction chamber; one or more outlets for removing vapor phase material from the reaction chamber; a plasma generator for generating a plasma that is exposed to the reaction chamber; and an undercoat on the interior surfaces of the reaction chamber, wherein the undercoat is about 0.5 μm thick or less, and wherein the undercoat conformally covers interior surfaces of the reaction chamber.

In some implementations, the undercoat on the interior surfaces of the reaction chamber may be formed by (a) introducing a flow of a first reactant in vapor phase into the reaction chamber and allowing the first reactant to adsorb onto the interior surfaces of the reaction chamber; (b) introducing a flow of a second reactant in vapor phase into the reaction chamber while the first reactant is adsorbed on the interior surfaces of the reaction chamber; and (c) exposing the reaction chamber to plasma when the flow of at least one of the first and second reactants has ceased, in order to drive a reaction between the first and second reactants on the interior of the reaction chamber to form the undercoat; where operations (a)-(c) occur when there is no substrate present in the reaction chamber. The undercoat on the interior surfaces of the reaction chamber may be about 0.2

μm thick or less. In certain embodiments, the reaction chamber further includes a substrate carrier conformally coated by the undercoat.

These and other features will be described below with reference to the associated drawings.

BRIEF DESCRIPTION OF THE DRAWINGS

FIG. 7 is a table presenting the surface concentration of various metals in films deposited on substrates in reaction chambers having different types of undercoats.

FIGS. 8 and 9 are tables showing the number of particles detected on films deposited in reaction chambers having different types of undercoats.

FIGS. 10A and 10B show particle maps illustrating where particles were detected on the films described in FIG. 9.

FIG. 11 is a table showing the uniformity of films deposited in a reaction chamber having an ALD-based undercoat.

DETAILED DESCRIPTION

Figure 1:
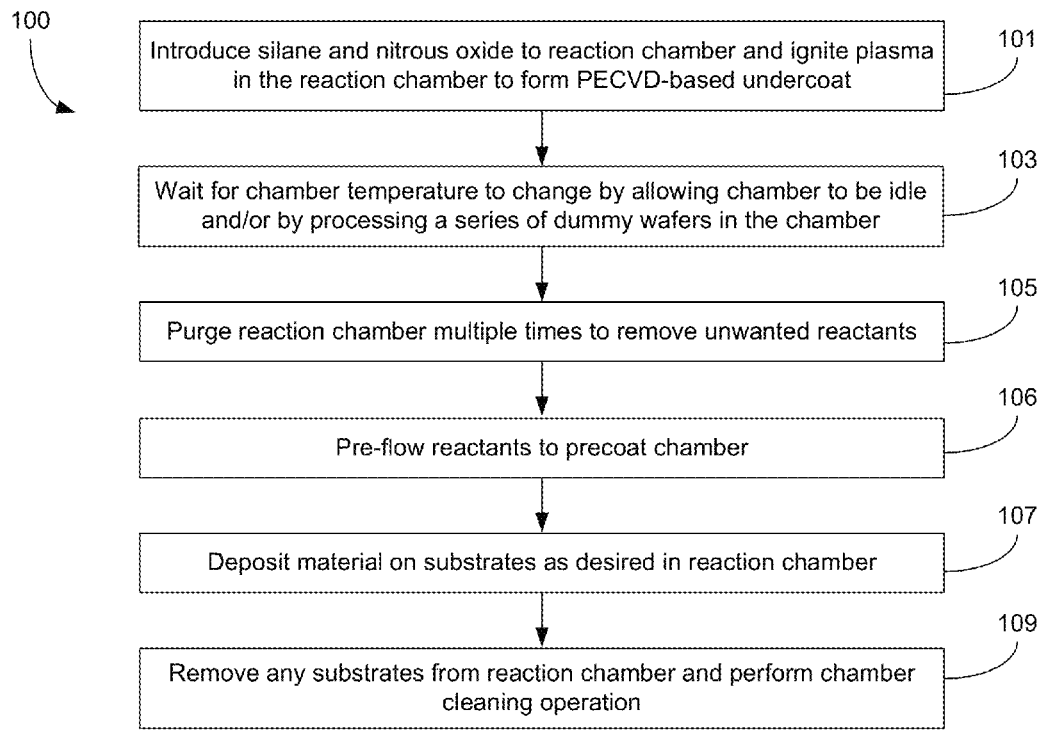
FIG. 1 shows a flowchart for processing substrates in a reaction chamber including depositing an undercoat through CVD-based methods.

In this application, the terms "semiconductor wafer," "wafer," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 or 300 mm, though the industry is moving towards the adoption of 450 mm diameter substrates. In addition to reaction chambers used to deposit films on semiconductor wafers, other types of deposition reactors may take advantage of this invention. Other types of reactors that may benefit from the disclosed embodiments include those used to fabricate various articles such as printed circuit boards, displays, and the like. In addition to semiconductor wafers, the methods and apparatus described herein may be used with deposition chambers configured for other types of substrates including glass and plastic panels.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Conformal, uniform silicon dioxide ($SiO_2$) films and other dielectric films have many applications in semiconductor manufacturing. A common application for thin $SiO_2$ films is the electrical isolation of adjacent transistors. Electrical isolation can be achieved by physically separating adjacent transistor components with insulating silicon dioxide. Chemical vapor deposition (CVD) and plasma enhanced chemical vapor deposition (PECVD) are sometimes the method of choice for depositing silicon oxide films or other films for shallow trench isolation (STI), particularly where the features are relatively large. However, as devices continue to shrink, the aspect ratios (depth to width) of features increase, and traditional CVD techniques can no longer provide adequately conformal films in these high aspect ratio features.

One alternative to CVD is atomic layer deposition (ALD) processing and plasma enhanced atomic layer deposition (PEALD) processing. Unless otherwise noted, the term ALD is intended to include PEALD, and the term CVD is intended to include PECVD in the following description. ALD methods involve self-limiting adsorption of reactant gases and can provide thin, conformal dielectric films within high aspect ratio features. ALD methods have been developed for the deposition of silicon oxide and other types of film. Films produced by ALD are very thin (e.g., about one monolayer); therefore, numerous ALD cycles may be repeated to adequately fill a gap feature.

In contrast with a CVD process, where activated gas phase reactions are used to deposit films, ALD processes use surface-mediated deposition reactions to deposit films on a layer-by-layer basis. In one example ALD process, a substrate surface, including a population of surface active sites, is exposed to a gas phase distribution of a first film precursor (P1). Some molecules of P1 may form a condensed phase atop the substrate surface, including chemisorbed species and physisorbed molecules of P1. The reactor is then evacuated to remove gas phase and physisorbed P1 so that only chemisorbed species remain. A second film precursor (P2) is then introduced to the reactor so that some molecules of P2 adsorb to the substrate surface. The reactor may again be evacuated, this time to remove unbound P2. Subsequently, energy provided to the substrate (e.g., thermal or plasma energy) activates surface reactions between adsorbed molecules of P1 and P2, forming a film layer. Finally, the reactor is evacuated to remove reaction by-products and possibly unreacted P1 and P2, ending the ALD cycle. Additional ALD cycles may be included to build film thickness.

Depending on the exposure time of the precursor dosing steps and the sticking coefficients of the precursors, each ALD cycle may deposit a film layer of, in one example, between about 0.5 Å-3 Å thick.

Conformal films may also be deposited on planar substrates. For example, antireflective layers for lithographic patterning applications may be formed from planar stacks including alternating film types. Such antireflective layers may be approximately 100 Å-1000 Å thick, making slower ALD processes less attractive than faster CVD processes. However, such anti-reflective layers may also have a lower tolerance for within-wafer thickness variation than many CVD processes may provide. For example, a 600 Å thick antireflective layer may tolerate a thickness range of less than 3 Å.

A related deposition technique that presents a feasible alternative to CVD for small feature sizes is conformal film deposition (CFD). Generally, CFD does not rely on complete purges of one or more reactants prior to reaction to form the film. For example, there may be one or more reactants present in the vapor phase when a plasma (or other activation energy) is struck. Accordingly, one or more of the process steps described in an ALD process (e.g., a purge step) may be shortened or eliminated in an example CFD process. Typically, a chamber capable of performing an ALD process is also capable of performing a CFD process. In some implementations, the novel undercoat formation process may be used to deposit an undercoat in a CVD, ALD or CFD reaction chamber. While the benefits of the novel undercoat may be greatest when used in conjunction with an ALD/CFD reactor, the embodiments are not limited to this context.

An undercoat can help improve wafer-to-wafer thickness uniformity and within-wafer thickness uniformity. The use of a chamber undercoat is especially beneficial in the context of a plasma processing apparatus, for example an apparatus used to deposit plasma enhanced atomic layer deposition (PEALD) films or plasma enhanced chemical vapor deposition (PECVD) films. An undercoat is often used to help reduce metal contamination and the formation of defect-inducing particles on the surfaces of the chamber. These particles can flake off the chamber surfaces and fall onto a substrate as film is being deposited, thereby causing undesirable film impurities and increasing the likelihood of device failure. Another advantage of using an undercoat is that it helps stabilize the impedance within a reactor.

One method of forming a chamber undercoat involves depositing undoped silicate glass (USG) on the chamber surfaces through a PECVD process. This process is typically performed without any substrates present in the chamber. The reactants used to deposit the USG include silane ($SiH_4$) and nitrous oxide ($N_2O$). Unfortunately, this reaction raises the temperature of the reaction chamber due to plasma heating effects related to the use of nitrous oxide. Where the reaction chamber is maintained at or below about 100° C., the plasma heating effect can be substantial. For example, the deposition of an undercoat may raise the temperature of the reaction chamber by about 4-8° C. This effect on the reaction chamber temperature significantly affects wafer-to-wafer uniformity. In order to stabilize the temperature of the reaction chamber and improve uniformity, a long idle time may be used (e.g., at least about ten minutes) after the undercoat is deposited and before any substrates are processed. Another method to stabilize the chamber temperature is to run one or more "dummy wafers" through several deposition cycles within the reaction chamber. The dummy wafers can be relatively inexpensive substrates that are not designed to be used in a final device. Both of these approaches slow down the production process and decrease throughput.

In addition to the long idle times and/or use of dummy wafers, the CVD-based undercoat formation method typically requires multiple flushes of the chamber to remove the USG-forming reactants. If these flushes are not performed, the silane and nitrous oxide may remain in the reaction chamber and cause undesirable reactions when the chamber is used to deposit a film on a substrate. These multiple flush operations increase the required processing time and decrease throughput.

A further problem related to the CVD-based undercoat deposition process is that there is a potential for mismatch between an area covered by the PECVD-based USG undercoat and, for example, and an area covered by a PEALD-deposited film. For example, a PEALD reaction chamber may be coated with a PECVD-based USG undercoat. The CVD-based undercoat will cover certain portions of the reaction chamber, but may inadequately cover other portions of the chamber. When the reaction chamber is then used to deposit a PEALD-based film on a substrate, some PEALD-based film will deposit on the undercoat of the reaction chamber. Because PECVD films and PEALD films are formed through different mechanisms, the coverage of the two films may be different. For instance, the PEALD-based film may extend to areas of the reaction chamber where the PECVD-based film did not reach. This coverage mismatch can contribute to flaking within the chamber, thus impacting both within-wafer and wafer-to-wafer uniformity.

Moreover, the presence of a PECVD-based film under a PEALD-based film can result in a composition and/or stress mismatch between these two films. These mismatches can also contribute to the particle flaking problem. As such, there exists a need for an improved method of depositing a reaction chamber undercoat.

An undercoat is defined as a layer of film formed on the interior surfaces of the reaction chamber prior to processing substrates in the reaction chamber. An undercoat is distinct from film buildup that occurs during a normal deposition process where material is deposited on substrates. In contrast to buildup that occurs during deposition on substrates, an undercoat is generally deposited without any substrates present in a reaction chamber. Further, an undercoat may be deposited directly on the bare chamber surfaces (e.g., on aluminum) or on a permanent layer on the chamber surfaces (e.g., aluminum fluoride), whereas film deposited during deposition on substrates is typically not in contact with these surfaces if it is deposited on top of a previously formed undercoat. A substrate is a solid piece of material that may be inserted and removed from the reaction chamber, which is not part of the reaction chamber, upon which film is deposited, and upon which film deposition is generally desired. In the context of semiconductor device fabrication, a semiconductor wafer (with or without film(s) deposited thereon) is a typical substrate. In many cases, substrates are disc-shaped and have a diameter of, for example, 200, 300 or 450 mm. Substrates typically go through many rounds of processing to become semiconductor devices. Certain other substrates, however, are not intended to become fully functioning devices. These substrates may be referred to as dummy wafers, and they may be used as test vehicles for evaluating a deposition process or as sacrificial substrates for equilibrating a reaction chamber, for example. When depositing the undercoat, the substrate-free chamber allows the undercoat to uniformly coat the chamber surfaces.

An undercoat is also distinct from a layer that may be deposited on chamber surfaces during certain test cycles, for example where a deposition process is run for a relatively small number of cycles without any substrates present. One difference is that the undercoat formation process is repeated many times to form a film of a desired minimum thickness. This minimum thickness is important in ensuring that the undercoat is able to function (e.g., minimize flaking and particle formation, and maximize uniformity) as desired.

The undercoat can improve uniformity by helping reduce metal contamination and particle flaking, and by helping balance the impedance of the reaction chamber. Films deposited in reaction chambers lacking an undercoat often have substantial metal contamination problems. In many cases, the reaction chamber itself is made of a metal (e.g., aluminum). When an uncoated metal chamber is exposed to plasma, small amounts of metal may be removed from the chamber surfaces and end up on the substrate film. These metal impurities can negatively affect the performance of the devices formed on the substrate, and in some cases can lead to device failure. With regard to balancing impedance, the chamber undercoat is especially useful when depositing CVD-based films, which deposit through gas phase reactions. Because the reaction chamber is made of metal and the film deposited on substrates is often a dielectric material, the impedance of the reaction chamber changes as the dielectric is deposited. Thus, by providing an undercoat, the impedance of the chamber can become relatively stabilized before any substrates are processed, thereby maximizing processing uniformity.

Certain methods for depositing a chamber undercoat involve the use of a PECVD method using silane and nitrous oxide. This method can raise the temperature of the reaction chamber by about 4-8° C. due to plasma heating effects related to the use of nitrous oxide. The heating effects are especially problematic with respect to film deposition methods performed at or below about 100° C. At these low deposition temperatures, the plasma heating effect is more pronounced. In order to process substrates in a uniform manner and with uniform results, CVD-based undercoat methods typically require a fairly long downtime between deposition of an undercoat and deposition of a film on a substrate in the newly coated reaction chamber (e.g., at least about ten minutes), and/or the use of dummy deposition wafers to stabilize chamber temperature. Additionally, multiple extensive flushes may be performed to remove all of the silane and nitrous oxide chemistry from the reaction chamber before a substrate is processed. Otherwise, these reactants can cause unwanted reactions within the chamber, which can cause film non-uniformities. The downtime/dummy wafers/flushes all contribute to relatively long processing times and decreased throughput.

Where the CVD-based undercoat is used in an ALD reaction chamber, additional problems may arise. For example, there may be a mismatch in coverage between a CVD-based undercoat and ALD-based film that is deposited on top of the undercoat when the chamber is used to deposit film on substrates. There may also be a mismatch in composition and/or stress levels between the CVD-based undercoat and the ALD-based film on the undercoat. These mismatches may promote particle formation/flaking at relatively low levels of film buildup. Unfortunately, this means that the reaction chamber must be cleaned fairly frequently. During the cleaning time, the reaction chamber is unavailable for depositing films on substrates. One aspect of the present embodiments is providing an undercoat that shows superior particle formation/flaking performance. By reducing the flaking problem, the reaction chamber does not have to be cleaned as often, more substrates may be processed between subsequent reaction chamber cleaning operations, and throughput can be maximized.

FIG. 1 presents a flowchart for a method of processing substrates in a reaction chamber. The method shown in FIG. 1 corresponds to a process in which a PECVD-based undercoat is deposited. In a typical processing scheme, the reaction chamber is "clean" at the beginning of operation 101. This means that there is no undercoat or other non-permanent deposited film present on the chamber surfaces. There may, however, be a layer of permanent material (e.g., aluminum fluoride) on the reaction chamber at this point. The aluminum fluoride layer may be formed in a previous operation by introducing a remotely generated fluorine plasma to the reaction chamber, for example. The reaction chamber's aluminum surfaces may react with the fluorine plasma to form the layer of aluminum fluoride. This aluminum fluoride layer is effectively permanent and is generally not removed in later cleaning operations. A reaction chamber having a layer of a permanent material such as aluminum fluoride is considered a "clean" chamber.

During the undercoat deposition process of 101, silane and nitrous oxide are flowed into the reaction chamber at the same time. A plasma is ignited in the reaction chamber, driving a gas-phase reaction between the silane and nitrous oxide to form undoped silicate glass (USG). In some cases, the plasma is generated by an RF plasma generator, and the RF power used to drive the generator is on the order of about 1800 W (divided among four stations, depositing on 300 mm diameter substrates). The reaction chamber surfaces become plated with the USG undercoat film. Examples of surfaces that become coated include the chamber walls/ceiling/floor, pedestal, substrate carrier ring, showerhead, exhaust system, fluid line, pump, spindle, wafer transfer arm, filler plates, secondary purge collars, etc. There may be certain surfaces that do not receive a uniform layer of undercoat during the CVD-based undercoat deposition. For example, surfaces which are not metallic are especially likely to receive inadequate or otherwise non-uniform coverage. In some cases, these non-metallic parts include a substrate carrier ring and associated hardware such as a lift arm/lift pin. These non-metallic parts often experience flaking before the metallic parts begin to flake. This relatively early flaking may be due to coverage, composition and/or stress mismatches between the CVD-deposited undercoat and the film deposited over the undercoat during deposition on substrates. Examples of non-metallic materials that a carrier ring and other components may be made of include ceramic materials.

During operation 101, the temperature of the reaction chamber is likely to rise, especially if the chamber is being maintained at relatively low temperatures (e.g., under about 100° C.). The fluctuating temperature may have a detrimental effect on wafer-to-wafer non-uniformity, because subsequent substrates will be processed at different temperatures as the chamber temperature equilibrates.

In order to reduce the non-uniformity problem, the method 100 may continue with operation 103, where the temperature of the reaction chamber is permitted to change to a desired, stable level, before processing any valuable substrates. During this waiting time, the reaction chamber may sit idle. Alternatively or in addition, the reaction chamber may be used to deposit film on a series of dummy wafers, which are relatively inexpensive substrates that are not desired for use in an end product.

At operation 105, the reaction chamber is purged/flushed multiple times to remove any unwanted reactants. In many cases, one or more of the reactants used to deposit the PECVD-based undercoat are incompatible with the reactants used to deposit films on substrates. This chemistry mismatch is especially likely where the undercoat is deposited through a CVD method and the reaction chamber is used to deposit ALD or CFD films on substrates. This mismatch can cause unwanted reactions during film deposition on substrates. In order to avoid these unwanted reactions, the reaction chamber is purged multiple times to remove any unwanted reactants. The purge may include flowing gas that does not contain the species to be removed from the chamber. Alternatively or in addition, the purge may include evacuating the reaction chamber. Operation 105 may occur before, during or after operation 103.

At operation 106, reactants used to deposit films on substrates are pre-flowed into the reaction chamber to precoat the chamber surfaces. This is typically done before any substrates are present in the reaction chamber. This precoat helps prime the gas delivery hardware (e.g., liquid chemical injectors, gas delivery lines, etc.) and other portions of the apparatus by exposing them to the reactants used during deposition.

Next, at operation 107 a series of substrates are processed in the reaction chamber. In certain cases, material is deposited on the substrates through an ALD or CFD method. As film is deposited on the substrates, film is also deposited on the interior surfaces of the reaction chamber. This film builds up over the course of processing many substrates, and eventually begins to peel or flake off. In one example of a USG undercoat deposited by method 100 to a thickness of about 1 µm, about 250 substrates may be processed before reaching the chamber total accumulation limit. This limit corresponds to (but does not exactly represent) the amount of film (including undercoat) deposited on the chamber surfaces at a point just before any sign of film flaking. The chamber total accumulation may not be a direct measurement of the amount of film on the chamber surfaces. Rather in some embodiments, an accumulation counter tracks the amount of film buildup based on the expected thickness of deposition per cycle. The chamber total accumulation limit may be chosen for a particular system based on the performance of the process. For example, the chamber total accumulation limit may be set to a value just below the accumulation counter value at which the chamber began to experience flaking.

Then, after the substrates are processed, the reaction chamber undergoes an in situ cleaning process in operation 109 to remove the deposited film and undercoat. This cleaning process is typically undertaken when no substrates are present in the reaction chamber. In many cases, the chamber cleaning process may involve introducing a gas phase species, e.g., a fluorine-containing compound, which reacts with the deposited film to form a volatile product that may be purged from the chamber. The processing scheme may then be repeated on the newly cleaned chamber.

The disclosed embodiments may use an ALD-based undercoat. In certain embodiments, an undercoat may be made from the same material as the one deposited on substrates in the reaction chamber. Example film types include doped or undoped oxides, nitrides, carbides, oxynitrides, carbonitrides, borides, noble metals, and high-k materials including, for example, lanthanide-oxides, group 4 metal oxides, and group 5 metal oxides. Oxides include a wide range of materials including undoped silicate glass (USG), and doped silicate glass. Examples of doped glasses include boron doped silicate glass (BSG), phosphorus doped silicate glass (PSG), and boron phosphorus doped silicate glass (BPSG). In certain embodiments, the undercoat is silicon oxide, silicon nitride or silicon carbide. The silicon oxide undercoat may be especially useful where the reaction chamber is used to deposit silicon oxide films on substrates. However, a silicon oxide undercoat may also be used in chambers used to deposit other types of films on substrates, as well. In certain embodiments, the undercoat is formed by the same process and process conditions as are used to deposit films on substrates in the relevant reaction chamber. These overlapping process conditions may include specific reactants, timing, RF power/frequency, temperature and/or pressure.

Figure 2:
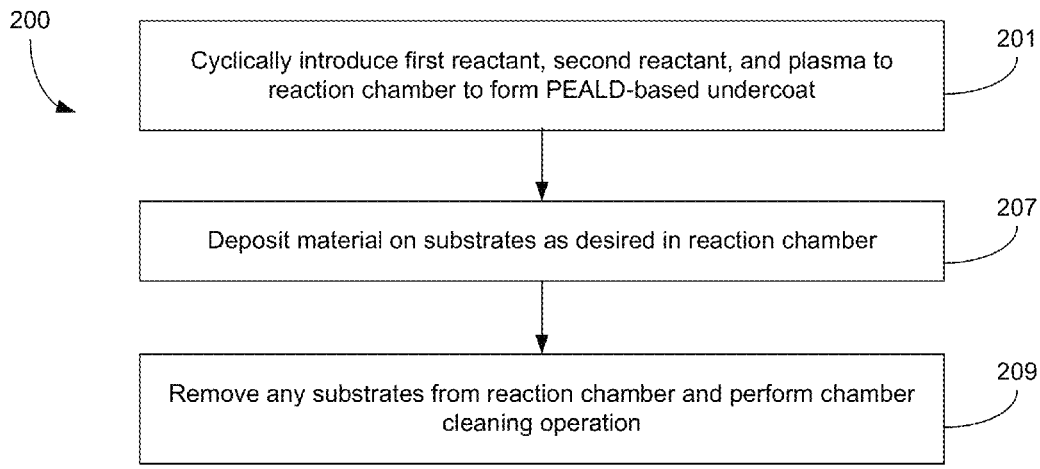
FIG. 2 shows a flowchart for processing substrates in a reaction chamber including depositing an undercoat through ALD-based methods.

FIG. 2 presents a flowchart for a method of processing substrates in a reaction chamber according to certain disclosed embodiments. The method shown in FIG. 2 differs from that shown in FIG. 1 in that the undercoat is formed through an ALD method instead of a CVD method. This results in the avoidance of multiple processing operations. The process 200 begins at operation 201, where the ALD-based undercoat is deposited. As in FIG. 1, the reaction chamber is typically clean at the beginning of operation 201. The deposition process 201 involves cyclically introducing a first reactant to the chamber and allowing it to adsorb onto chamber surfaces, introducing a second reactant to the chamber while the first reactant is adsorbed onto chamber surfaces, and exposing the chamber to plasma to drive a surface reaction between the first and second reactants. In certain embodiments where the undercoat is deposited through CFD methods, one of the reactants may be delivered continuously. The undercoat deposition 201 may also involve one or more purge operations after introduction of one or both reactants and/or after plasma exposure. This undercoat deposition process 201 is further described with reference to FIGS. 3 and 4. Example process conditions for implementing the undercoat deposition process 201 are described further below, though the embodiments are not limited to these particular conditions.

Where an ALD-based undercoat is used, it is possible to reduce or eliminate the need for several of the processing steps described in relation to FIG. 1. For example, operations 103 (waiting for chamber temperature to fall), 105 purging reaction chamber to remove unwanted reactants), and 106 (pre-flowing reactants to precoat chamber) may be eliminated in some embodiments. In other embodiments, one or more of these operations may take place. In these cases, one or more of the listed operations may be done more quickly than in a conventional setting. For instance, a CVD-based undercoat deposition process may raise the temperature of the reaction chamber by about 4-8° C., whereas an ALD-based undercoat deposition process may raise the temperature of the reaction chamber to a lower degree, for example less than 1° C. in many cases. As such, if any waiting is required to allow the temperature of the reaction chamber to equilibrate, this waiting period will be substantially shorter than that required for a CVD-based undercoat deposition process. In some embodiments, the reaction chamber will be purged one or more times, and reactants may be pre-flowed to the reaction chamber between operations 201 and 207. These operations may continue to be helpful, particularly where different reactants are used to deposit the undercoat and the film on substrates. In embodiments where the same reactants are used to deposit the undercoat and film on substrates, however, these purging and pre-flowing steps may be eliminated.

The process 200 continues with operation 207, where material is deposited on substrates as desired in the reaction chamber. In certain embodiments, the material is deposited on the substrates through an ALD or CFD method. As mentioned above, the process and process conditions used to deposit the films on the substrates may be the same as those used to deposit the undercoat.

Next, once the chamber total accumulation limit is met and flaking begins or is likely to begin occurring, any substrates present in the reaction chamber are removed, and the chamber is cleaned. The cleaning process removes both the film buildup deposited during deposition on substrates, as well as the undercoat. At the end of operation 209, the reaction chamber is clean and the process 200 may be repeated.

While the above description focuses on the deposition of an ALD-based undercoat in the context of processing many wafers, other embodiments may be directed to more limited portions of this process. For example, some embodiments relate to the deposition of an ALD-based undercoat in the context of a single cleaning process. The cleaning process may include operation 209 followed by operation 201 of FIG. 2, for example. In this embodiment, the reaction chamber is covered in film (and potentially but not necessarily an undercoat) at the outset of the process. The reaction chamber is cleaned according to the cleaning methods described elsewhere herein. The cleaning process removes any film and undercoat present on the chamber surfaces. After the chamber is cleaned, a new undercoat is deposited through ALD-based methods as described in relation to operation 201.

Another embodiment relates to a method of depositing films on substrates including operation 201 followed by operation 207 of FIG. 2. In this embodiment, the method begins with a clean reaction chamber. An undercoat is deposited through ALD-based methods as described in relation to operation 201. Next, a substrate is loaded into the reaction chamber, and a film is deposited thereon in operation 207. This operation may continue by removing the substrate and processing additional substrates as desired. In this embodiment, no cleaning of the reaction chamber may be performed.

Another embodiment is directed to a method of depositing an ALD-based undercoat in a reaction chamber, as described in relation to operation 201 of FIG. 2. This embodiment may be practiced without placing a substrate in the reaction chamber. This may also be referred to as a wafer-less ALD undercoat deposition method. As mentioned, this method is further discussed with relation to FIGS. 3 and 4.

The use of an ALD-based undercoat is beneficial for several reasons. First, the ALD-based undercoat may be deposited without raising the temperature of the reaction chamber. Because the temperature of the chamber stays relatively constant, the wafer-to-wafer uniformity is improved. In some embodiments, the temperature of the reaction chamber rises no more than about 2° C., for example no more than about 1° C., during deposition of the undercoat. Where the rise in temperature during the undercoat deposition process is less than about 1° C., the process may be considered "isothermal." The temperature-stable ALD-based reaction reduces or eliminates the need for long idle times or dummy wafers to stabilize the chamber temperature. Furthermore, the ALD-based undercoat and the ALD-based film deposited on the substrate may both be formed using the same set of chemistry. This eliminates the need to perform multiple flushes of the reaction chamber before depositing films on substrates.

Another advantage to using ALD-based undercoats is that they achieve better flaking/particle performance than CVD-based undercoats. The Experimental section, below, provides data related to particle performance in reaction chambers having CVD- or ALD-based undercoats. To briefly summarize the experimental findings, a 2000 Å thick ALD-based silicon oxide undercoat allowed the chamber to process about three times as many substrates than a chamber having a 2 µm thick CVD-based USG undercoat. The upper limit on the number of processed substrates was determined by flaking/particle formation within the reaction chamber (i.e., the chamber total accumulation limit). The ALD-based undercoat reached a higher chamber total accumulation limit before flaking occurred. The higher total accumulation limit, along with a corresponding increase in the number of substrates that may be processed between chamber cleaning operations, contributes to an increase in throughput. A chamber cleaning process often takes between about 20-90 minutes to complete, during which time the reaction chamber is unavailable for processing substrates. Cleaning operations performed at higher temperatures may be conducted quicker than cleaning that occurs at lower temperatures. Also, thicker film buildups require longer cleaning times. A 50° C. cleaning operation to remove 2 µm of material may take about 40 minutes, while the same cleaning operation to remove 4 µm of material may take about 90 minutes. At higher temperatures such as 400° C., a 4 µm layer of material may be cleaned/removed in about 20 minutes. It is beneficial to maximize the number of substrates that can be processed between chamber cleaning operations in order to minimize the necessary downtime associated with cleaning processes.

A related benefit of the ALD-based undercoats is that they achieve adequate flaking/particle performance at a much lower undercoat thickness compared to the thickness required for CVD-based undercoats. A thinner undercoat may be desirable because it requires less material, and because it allows additional substrates to be processed before reaching the chamber total accumulation limit, which positively impacts throughput.

Without wishing to be bound by theory, it is believed that the improved particle performance may be due to an increase in the similarity between the undercoat and the film deposited on the undercoat during deposition on substrates. The increased similarity may relate to the coverage of the films, the composition of the films, the stress of the films, etc. It is believed that flaking is more likely to occur where there is an interface between different types of film, and that greater degrees of difference between the films increases the likelihood for flaking to occur. By increasing the similarity of the films at the interface between the undercoat and film deposited on the undercoat, particle formation may be minimized.

One drawback to ALD-based undercoats is that they take a relatively long time to deposit. For example, while a 1 CVD-based undercoat may take about 3 minutes to deposit, an ALD-based undercoat may take about 15 minutes to deposit. This increased deposition time results from the careful management of reactants and the cyclic nature of the ALD deposition process. Whereas a CVD-based undercoat may be formed in a single step by delivering, for example, silane and nitrous oxide to the substrate in the presence of plasma, the ALD-based deposition is more complicated. Because ALD-based undercoats take much longer to deposit, it was thought that these undercoats would cause an increase in processing time and a decrease in throughput.

However, it was unexpectedly found that the ALD-based undercoats show better flaking/particle formation performance, which advantageously increases the number of substrates that may be processed between subsequent chamber cleaning operations. Further, it was unknown that the ALD-based undercoats would perform adequately at much thinner undercoat thicknesses than previously used with CVD-based undercoats. Whereas CVD-based undercoats may require a thickness of about 1-2 µm thick for adequate performance (which would take a very long time to deposit through cyclic ALD processes that build up slowly), this relatively large thickness is not required for an adequately performing ALD-based undercoat. Adequate ALD-based undercoat performance was instead achieved at an undercoat thickness of about 0.1-0.2 µm. This thickness is about an order of magnitude lower than the thickness required for CVD-based undercoats. Comparison of ALD- and CVD-based undercoat performance is shown below in the Experimental section. While it was thought that ALD-based undercoats would slow down production and decrease throughput, the unanticipated advantages arising from the use of the ALD-based undercoat deposition process may outweigh the increased undercoat deposition time, and result in an overall increase in throughput.

Figure 3:
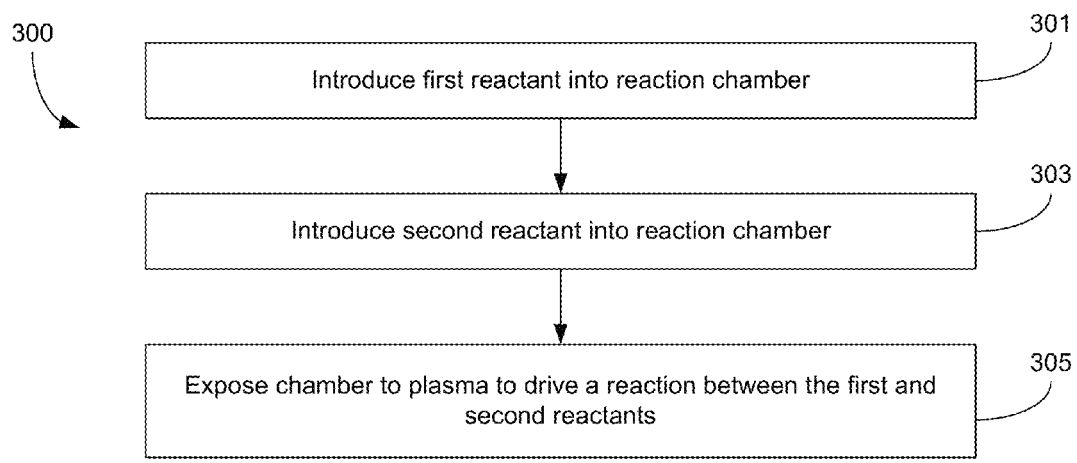
FIG. 3 presents a flowchart for a method of depositing an undercoat through ALD-based methods.

FIG. 3 provides a flowchart for a method of depositing an ALD-based undercoat in a clean reaction chamber. As mentioned above, the clean reaction chamber may have a permanent layer of aluminum fluoride or other material on the interior surfaces. The method 300 begins at operation 301, where a first reactant is introduced into the reaction chamber. The reaction chamber does not contain a substrate while the undercoat is being deposited. The first reactant will generally adsorb onto the surfaces of the reaction chamber during operation 301, forming a layer of reactant material. This layer is generally, though not necessarily, a monolayer of the reactant material. Next, a second reactant may be introduced into the reaction chamber at operation 303 while the first reactant is adsorbed onto the chamber surfaces. This second reactant may also adsorb onto the surfaces of the reaction chamber to form a monolayer of the second reactant. Then, at operation 305, the reaction chamber is exposed to plasma to drive a surface reaction between the first and second reactants. This forms a layer of undercoat on the interior surfaces of the reaction chamber. The undercoat may be in direct contact with the underlying aluminum chamber parts, or may be in direct contact with an underlying layer of aluminum fluoride. In some embodiments, one or more purge operations may take place after operations 301, 303 and/or 305. The purge may include sweeping the reaction chamber with a gas that is free of the species being purged. Alternatively or in addition, the purge may include evacuating the reaction chamber and performing a pump down to a low pressure (e.g., less than about 1 Torr).

In should also be noted that while FIGS. 2 and 3 refer to first and second reactants, in some embodiments, a single reactant may be cyclically introduced, adsorbed, and decomposed to form an ALD-based undercoat. Still further, in some embodiments, one or more additional reactants (e.g., a third reactant) may be introduced, for example, to form ternary films.

Figure 4:
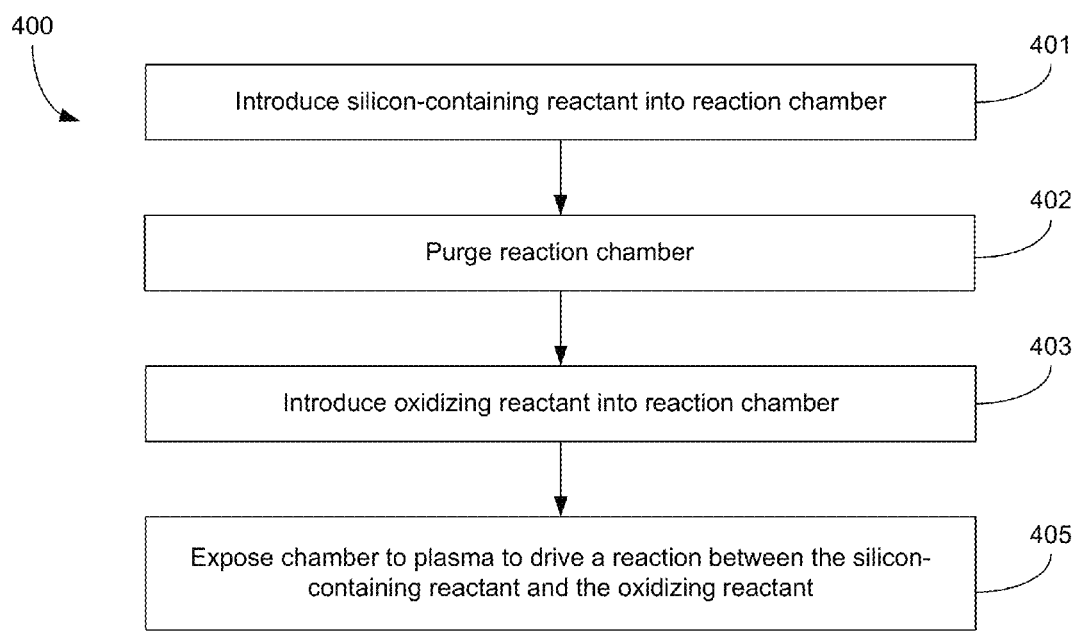
FIG. 4 shows a flowchart for a method of depositing a silicon oxide undercoat through ALD-based methods.

FIG. 4 provides a flowchart for an exemplary method of depositing an ALD-based silicon oxide undercoat. The method 400 begins at operation 401, where a silicon-containing reactant is introduced to the reaction chamber. In one example, the silicon-containing reactant is BTBAS (bis(tertiarybutylamino)silane, $SiH_2(NHC(CH_3)_3)_2$). The silicon-containing reactant may be provided at a rate of about 1.5-2.5 mL/min, for example about 1 mL/min. The silicon-containing reactant may be provided over a period of about 0.1-0.5 seconds, for example about 0.2 seconds. The silicon-containing reactant adsorbs onto the surfaces of the reaction chamber. The temperature of the reaction chamber, for example the temperature of a substrate holder, may be maintained between about 25-450° C. Next, the flow of the silicon-containing reactant stops, and the reaction chamber is purged at operation 402. The purge removes any residual silicon-containing reactant that is not strongly adsorbed to the reaction chamber surfaces. The purge may occur by flowing a non-reactive gas into the reaction chamber, and/or by evacuating the reaction chamber. In some embodiments, the reaction chamber is purged for a period between about 0.1-0.5 seconds, for example about 0.2 seconds. Next, an oxidizing reactant is provided to the reaction chamber at operation 403. In a particular example, the oxidizing reactant is a mix of $O_2/N_2O$ in equal or substantially equal flows (as measured in standard liters per minute (SLM)). In some implementations, the oxidizing reactant is about 60% or less $N_2O$, or about 50% or less $N_2O$, as measured in SLM. The flow rate of the oxidizing reactant may be between about 10-40 SLM total. The flow rates of the $O_2$ and $N_2O$ may independently be between about 5-20 SLM, for example about 10 SLM. The oxidizing reactant may be provided to the reaction chamber for a period between about 0.05-0.75 seconds, for example about 0.3 seconds. The chamber may then be exposed to plasma to drive a reaction between the silicon-containing reactant and the oxidizing reactant at operation 405. In some embodiments, the plasma is generated by an RF plasma generator. The RF generator may provide about 100-2500 W/station, for example about 125 W/station to generate the plasma. In some embodiments, operations 403 and 405 occur concurrently or partially concurrently. The duration of the plasma exposure may be between about 0.05-0.75 seconds, for example about 0.3 seconds. The reaction chamber may then be purged (not shown) after the plasma is extinguished. The purge may occur over a period of about 0.05-0.5 seconds, for example about 0.15 seconds. The flow rates, times, and reactants provided are merely examples and are not intended to be limiting.

The flow of an oxidizing reactant or other co-reactant may be continuous or pulsed. In some cases where the flow is continuous, the flow may be periodically diverted from the reaction chamber. In this case, although the oxidant reactant flows continuously, its flow into the reaction chamber is pulsed. In certain embodiments, a continuous oxidant flow is used, but the oxidant flow is only introduced to the reaction chamber during an oxidant delivery pulse, which may occur plasma exposure. During the other times, the oxidant flow may be diverted to another portion of the processing apparatus.

ALD- and CFD-based deposition methods are further described in U.S. patent application Ser. No. 13/084,399, filed Apr. 11, 2011, and titled "PLASMA ACTIVATED CONFORMAL FILM DEPOSITION," which is herein incorporated by reference in its entirety. While the '399 application focuses on the deposition of films on substrates, the teachings are also applicable to the deposition of an undercoat on a reaction chamber when there is no substrate present in the chamber.

Reactants

The disclosed embodiments may be used with a variety of reactants to form various kinds of undercoats and films. While certain implementations are described in the context of BTBAS in combination with oxygen and nitrous oxide, the embodiments are not so limited. Any appropriate silicon-containing reactant and oxidant may be used for the deposition of silicon oxide undercoats and films. Similarly, for the deposition of silicon nitride undercoats and films, any appropriate silicon-containing reactant and nitrogen-containing reactant may be used. Further, for the deposition of metal oxide or metal nitride undercoats and films, any appropriate metal-containing reactants and co-reactants may be used. The techniques herein are beneficial in implementing a wide variety of film chemistries.

In some embodiments, a silicon-containing reactant may be used. The silicon-containing reactant may include, for example, a silane, a halosilane or an aminosilane. A silane contains hydrogen and/or carbon groups, but does not contain a halogen. Examples of silanes are silane ($SiH_4$), disilane ($Si_2H_6$), and organo silanes such as methylsilane, ethylsilane, isopropylsilane, t-butylsilane, dimethylsilane, diethylsilane, di-t-butylsilane, allylsilane, sec-butylsilane, thexylsilane, isoamylsilane, t-butyldisilane, di-t-butyldisilane, and the like. A halosilane contains at least one halogen group and may or may not contain hydrogens and/or carbon groups. Examples of halosilanes are iodosilanes, bromosilanes, chlorosilanes and fluorosilanes. Although halosilanes, particularly fluorosilanes, may form reactive halide species that can etch silicon materials, in certain embodiments described herein, the silicon-containing reactant is not present when a plasma is struck. Specific chlorosilanes are tetrachlorosilane ($SiCl_4$), trichlorosilane ($HSiCl_3$), dichlorosilane ($H_2SiCl_2$), monochlorosilane ($ClSiH_3$), chloroallylsilane, chloromethylsilane, dichloromethylsilane, chlorodimethylsilane, chloroethylsilane, t-butylchlorosilane, di-t-butylchlorosilane, chloroisopropylsilane, chloro-sec-butylsilane, t-butyldimethylchlorosilane, thexyldimethylchlorosilane, and the like. An aminosilane includes at least one nitrogen atom bonded to a silicon atom, but may also contain hydrogens, oxygens, halogens and carbons. Examples of aminosilanes are mono-, di-, tri- and tetra-aminosilane ($H_3Si(NH_2)_4$, $H_2SKNH_2)_2$, $HSi(NH_2)_3$ and $Si(NH_2)_4$, respectively), as well as substituted mono-, di-, tri- and tetra-aminosilanes, for example, t-butylaminosilane, methylaminosilane, tert-butylsilanamine, bis(tertiarybutylamino)silane ($SiH_2(NHC(CH_3)_3)_2$ (BTBAS), tert-butyl silylcarbamate, $SiH(CH_3)—(N(CH_3)_2)_2$, $SiHCl—(N(CH_3)_2)_2$, $(Si(CH_3)_2NH)_3$ and the like. A further example of an aminosilane is trisilylamine ($N(SiH_3)_3$).

In other cases, the deposited film contains metal. Examples of metal-containing films that may be formed include oxides and nitrides of aluminum, titanium, hafnium, tantalum, tungsten, manganese, magnesium, strontium, etc., as well as elemental metal films. Example precursors may include metal alkylamines, metal alkoxides, metal alkylamides, metal halides, metal β-diketonates, metal carbonyls, organometallics, etc. Appropriate metal-containing precursors will include the metal that is desired to be incorporated into the film. For example, a tantalum-containing layer may be deposited by reacting pentakis(dimethylamido)tantalum with ammonia or another reducing agent. Further examples of metal-containing precursors that may be employed include trimethylaluminum, tetraethoxytitanium, tetrakis-dimethyl-amido titanium, hafnium tetrakis(ethylmethylamide), bis(cyclopentadienyl)manganese, bis(n-propylcyclopentadienyl)magnesium, etc.

In some embodiments, the deposited film contains nitrogen, and a nitrogen-containing reactant is used. A nitrogen-containing reactant contains at least one nitrogen, for example, ammonia, hydrazine, amines (e.g., amines bearing carbon) such as methylamine, dimethylamine, ethylamine, isopropylamine, t-butylamine, di-t-butylamine, cyclopropylamine, sec-butylamine, cyclobutylamine, isoamylamine, 2-methylbutan-2-amine, trimethylamine, diisopropylamine, diethylisopropylamine, di-t-butylhydrazine, as well as aromatic containing amines such as anilines, pyridines, and benzylamines. Amines may be primary, secondary, tertiary or quaternary (for example, tetraalkylammonium compounds). A nitrogen-containing reactant can contain heteroatoms other than nitrogen, for example, hydroxylamine, t-butyloxycarbonyl amine and N-t-butyl hydroxylamine are nitrogen-containing reactants.

In certain implementations, an oxygen-containing reactant is used. Examples of oxygen-containing reactants include oxygen, ozone, nitrous oxide, nitric oxide, nitrogen dioxide, carbon monoxide, carbon dioxide, sulfur oxide, sulfur dioxide, oxygen-containing hydrocarbons ($C_xH_yO_z$), water, mixtures thereof, etc.

Timing

FIGS. 3 and 4 and their corresponding descriptions disclose general outlines for depositing an undercoat through ALD-based methods. In some cases, one of the reactants may be delivered continuously (e.g., even during delivery of other reactants and/or during plasma exposure). The continuously flowing reactant may be delivered to the reaction chamber in conjunction with a carrier gas—e.g., argon, helium, etc. Typically in embodiments in which an oxide or nitride undercoat is deposited, a continuously flowing reactant will be an oxygen- or nitrogen-containing reactant. Where a reactant is delivered continuously, the deposition may be referred to as a conformal film deposition (CFD) method. These CFD methods are within the scope of the present embodiments. In other cases, all reactants may be delivered in pulses. Where this is the case, the reactant pulses may be delivered to the reaction chamber in an alternating fashion, such that only a single reactant is being introduced to the reaction chamber at a given time.

As mentioned above, the use of the ALD-based undercoat may reduce or eliminate the need to wait for the reaction chamber temperature to equilibrate between deposition of the undercoat and deposition on substrates. The ALD-based undercoat also may eliminate the need to flush the reaction chamber multiple times to remove unwanted undercoat reactants, and the need to pre-flow reactants used to form film on substrates. As such, in certain embodiments, films may be deposited on substrates in the reaction chamber immediately after the undercoat is formed. In some cases, a first reactant for forming a film on a substrate is delivered to a reaction chamber having a non-dummy substrate therein within about 5 minutes after the undercoat is formed. In some embodiments, the time between termination of the undercoat formation process and delivery of a reactant to form a film on a substrate may be reduced to less than about 3 minutes, or less than about 1 minute, or less than about 30 seconds.

Reaction Chamber Conditions During ALD-Deposition

The disclosed embodiments are not limited to use with particular reaction chamber temperatures, pressures, etc. Typical reaction chamber temperatures during deposition of an undercoat and/or during deposition of a film on a substrate range from about 25-450° C. However, the throughput benefits of the disclosed embodiments may be most effective where the process for depositing film on substrates in the reaction chamber occurs at relatively low temperatures, e.g., less than about 200° C. and in some cases less than about 100° C. In these or other cases, the temperature may be at least about 25° C. In some cases, the ALD-based undercoat is used with a reaction chamber that is used to deposit films on substrates at higher temperatures. ALD-based undercoats may be beneficial at these high temperatures because they may allow processing to occur at higher temperatures than is possible with CVD-based undercoats. In other words, the ALD-based undercoats may expand the possible processing window for ALD-based films deposited on substrates.

The pressure in the reaction chamber during deposition of the undercoat and/or during deposition of films on substrates may be between about 1-10 Torr.

Plasma Generation Conditions During ALD-Deposition

In a PEALD operation, the substrate is exposed to plasma to drive the reaction between the first and second reactants. Various types of plasma may be used to drive this reaction including capacitively coupled plasmas and inductively coupled plasmas. Various types of plasma generators may be used including RF, DC, and microwave plasma generators. Moreover, according to various embodiments, the plasma may be direct or remote.

Where an RF plasma generator is used, the RF power may be between about 100-2500 W/station, as calculated for a 300 mm diameter wafer. The power level scales linearly with substrate area, and may be scaled accordingly for substrates of other sizes. For example, an RF power of 500 W/station for a 300 mm wafer would correspond to an RF power of about 1125 W/station for a 450 mm wafer. The RF frequency used to drive the plasma may have a high frequency (HF) and/or low frequency (LF) component. Example HF RF frequencies may include, but are not limited to, frequencies between about 1.8 MHz-2.45 GHz. Common HF frequencies include 13.56 MHz and 27 MHz. Example LF frequencies may include, but are not limited to, frequencies between about 50-500 kHz. In some embodiments, only HF frequency is used. In other embodiments, LF frequencies are used in addition to HF frequencies. In other embodiments, only an LF frequency is used.

The gas used to generate the plasma may vary. In some embodiments, plasma may be ignited while one of the reactants (e.g., an oxygen- or nitrogen-containing reactant) is present in the reaction chamber in gaseous form, such that the plasma is generated from this reactant. Alternatively or in addition, the plasma may be generated from an inert gas.

Cleaning the Reaction Chamber

The disclosed embodiments are not limited to any particular chamber cleaning method. Any method that removes all or substantially all of the deposited film and undercoat may be used. Chamber cleaning methods are further discussed and described in the following U.S. patents and patent applications, each of which is incorporated herein in its entirety and for all purposes: U.S. Pat. No. 7,479,191, titled "METHOD FOR ENDPOINTING CVD CHAMBER CLEANS FOLLOWING ULTRA LOW-K FILM TREATMENTS"; U.S. Pat. No. 8,262,800, titled "METHODS AND APPARATUS FOR CLEANING DEPOSITION REACTORS"; U.S. patent application Ser. No. 12/355,601, filed Jan. 16, 2009, and titled "PLASMA CLEAN METHOD FOR DEPOSITION CHAMBER"; and U.S. patent application Ser. No. 13/654,303, filed Oct. 17, 2012, and titled "METHODS AND APPARATUS FOR CLEANING DEPOSITION CHAMBERS."

There are two general types of chamber cleaning methods that are frequently used to clean deposition chambers. These include plasma cleaning methods (sometimes referred to as dry cleaning methods) and wet cleaning methods.

Plasma cleaning procedures can be done using either in situ chamber cleans or remote chamber cleans. In in situ chamber cleans, the chamber clean chemicals are introduced into the reaction chamber in a gaseous state and plasma excitation within the reaction chamber is used to dissociate the chamber clean chemicals into reactive radicals and ions. In remote cleans, an independent plasma source is used to dissociate the gaseous chamber clean chemicals into strongly reactive radicals and ions outside the reaction chamber, and the dissociated chamber clean chemicals are then introduced into the reaction chamber. In both in situ and remote chamber cleans, the reactive species in the chamber react with the accumulated deposited films and undercoat to form gaseous products that are evacuated from the chamber. In many cases, the chamber clean chemicals include fluorine-containing species, for example NF3 that may be optionally mixed with inert gas such as He or Ar. Where a fluorine-containing cleaning chemical is used, $SiO_2$ present in the chamber may be converted to $SiF_4$, a volatile substance that may be removed by purging (e.g., sweeping and/or evacuating) the reaction chamber.

After a number of plasma cleaning cycles, the substrate deposition process may degrade and a wet clean may be used. In wet cleaning procedures, the reaction chamber is vented to atmosphere and the interior surfaces of the reactor are physically scrubbed using appropriate cleaning solutions (e.g., isopropanol (IPA) and/or water) and/or abrasives. Wet cleaning removes any thick and flaked accumulation that was not cleaned effectively with the plasma cleaning methods. This type of cleaning procedure is time consuming, labor intensive, and may require reconditioning of the chamber once completed. For example, the wet cleaning method may remove the layer of aluminum fluoride under the undercoat. As such, the wet cleaning methods are used sparingly and the plasma cleaning methods are used when possible.

Apparatus

Figure 5A:
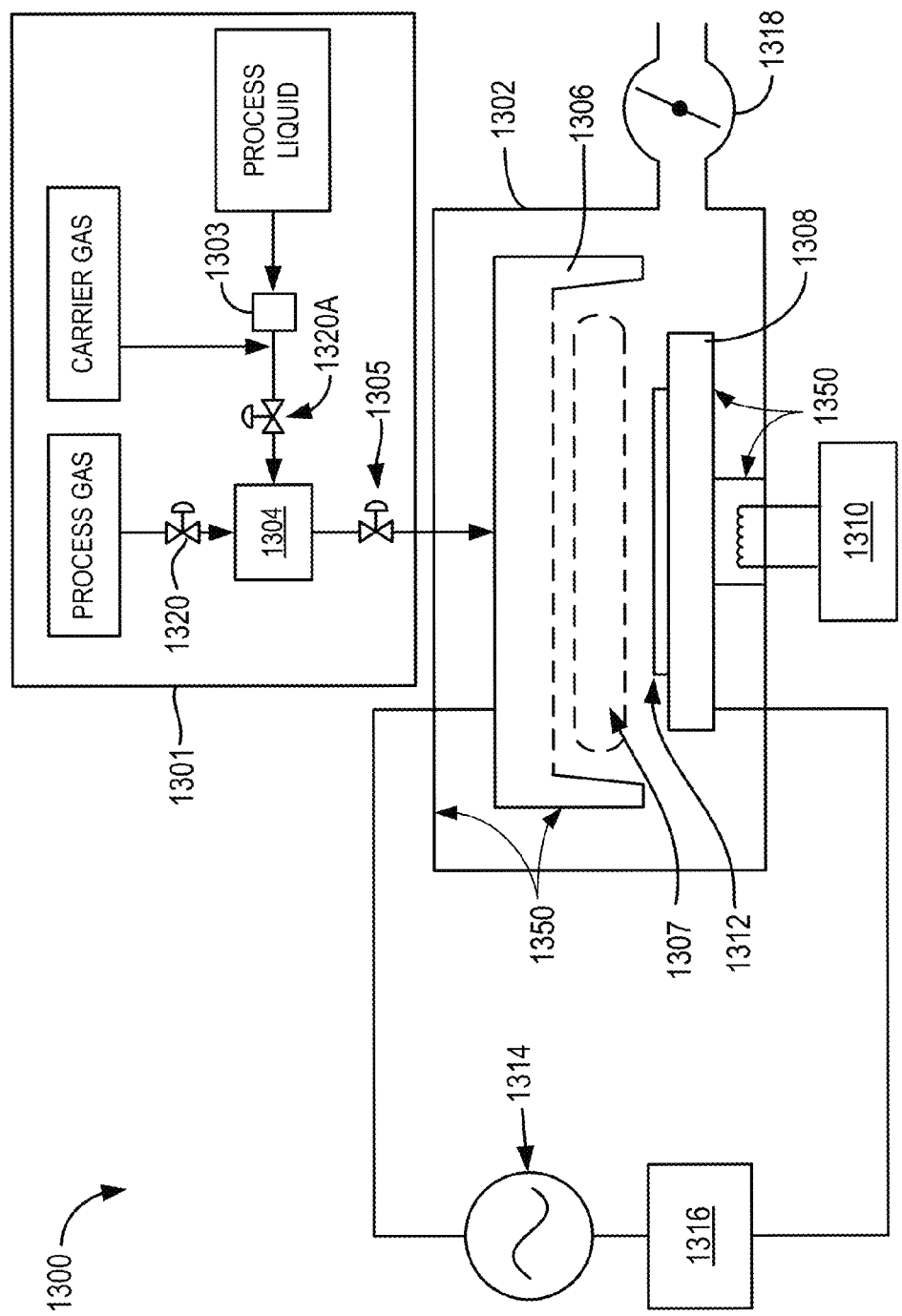
FIGS. 5A and 5B show embodiments of a reaction chamber according to certain disclosed embodiments.
Figure 6:
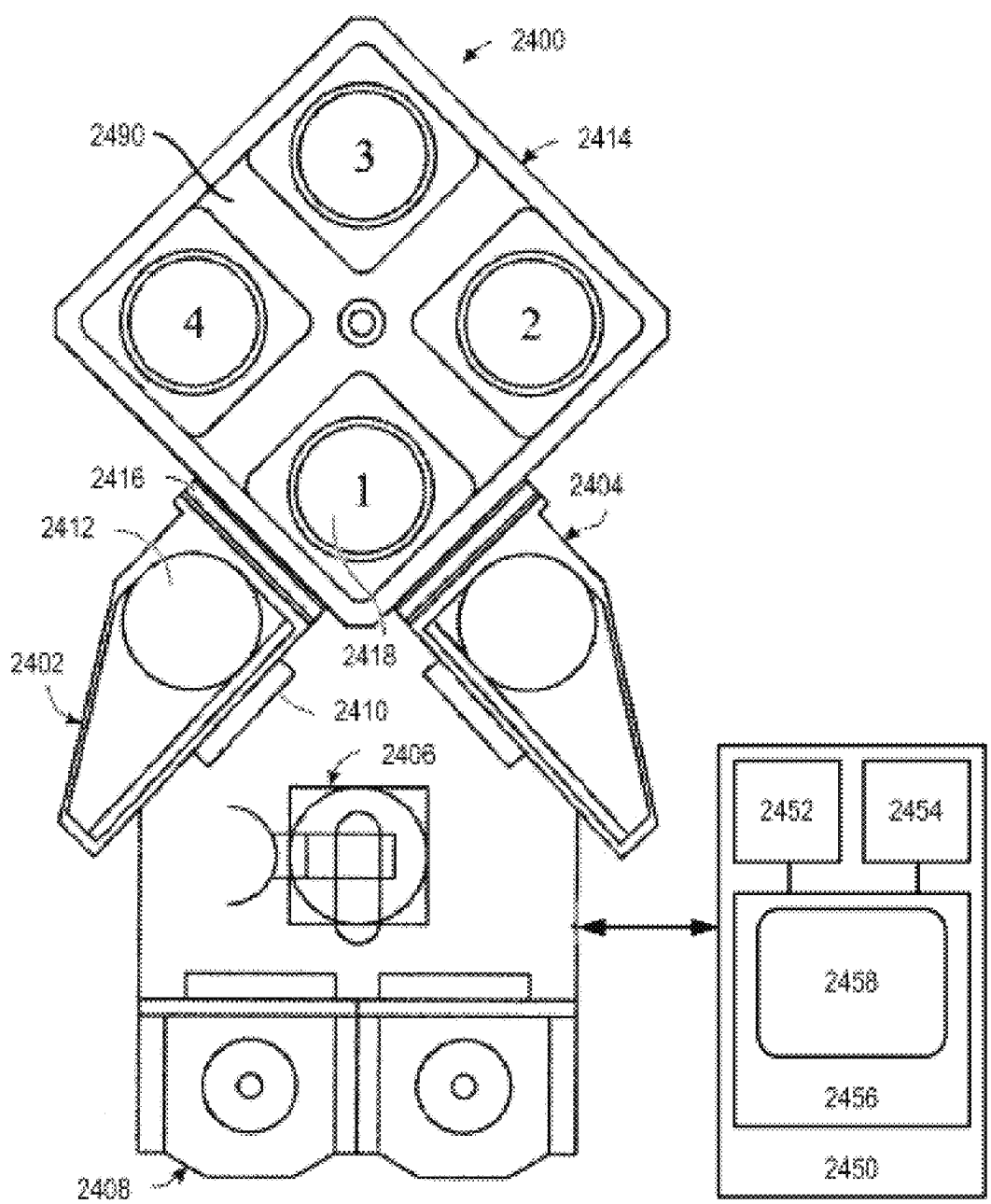
FIG. 6 shows a multi-tool semiconductor plating apparatus according to certain disclosed embodiments.

It will be appreciated that any suitable process station may be employed with the embodiments described above. For example, FIG. 5A schematically shows an embodiment of a ALD/CFD process station 1300. For simplicity, process station 1300 is depicted as a standalone process station having a process chamber body 1302 for maintaining a low-pressure environment. However, it will be appreciated that a plurality of process stations 1300 may be included in a common process tool environment. For example, FIG. 6 depicts an embodiment of a multi-station processing tool 2400. Further, it will be appreciated that, in some embodiments, one or more hardware parameters of process station 1300, including those discussed in detail above, may be adjusted programmatically by one or more computer controllers.

ALD/CFD process station 1300 fluidly communicates with reactant delivery system 1301 for delivering process gases to a distribution showerhead 1306. Reactant delivery system 1301 includes a mixing vessel 1304 for blending and/or conditioning process gases for delivery to showerhead 1306. One or more mixing vessel inlet valves 1320 may control introduction of process gases to mixing vessel 1304.

Some reactants, like BTBAS, may be stored in liquid form prior to vaporization at and subsequent delivery to the process station. For example, the embodiment of FIG. 5A includes a vaporization point 1303 for vaporizing liquid reactant to be supplied to mixing vessel 1304. In some embodiments, vaporization point 1303 may be a heated vaporizer. The saturated reactant vapor produced from such vaporizers may condense in downstream delivery piping. Exposure of incompatible gases to the condensed reactant may create small particles. These small particles may clog piping, impede valve operation, contaminate substrates, etc. Some approaches to addressing these issues involve sweeping and/or evacuating the delivery piping to remove residual reactant. However, sweeping the delivery piping may increase process station cycle time, degrading process station throughput. Thus, in some embodiments, delivery piping downstream of vaporization point 1303 may be heat traced. In some examples, mixing vessel 1304 may also be heat traced. In one non-limiting example, piping downstream of vaporization point 1303 has an increasing temperature profile extending from approximately 100 degrees Celsius to approximately 150 degrees Celsius at mixing vessel 1304.

In some embodiments, reactant liquid may be vaporized at a liquid injector. For example, a liquid injector may inject pulses of a liquid reactant into a carrier gas stream upstream of the mixing vessel. In one scenario, a liquid injector may vaporize reactant by flashing the liquid from a higher pressure to a lower pressure. In another scenario, a liquid injector may atomize the liquid into dispersed microdroplets that are subsequently vaporized in a heated delivery pipe. It will be appreciated that smaller droplets may vaporize faster than larger droplets, reducing a delay between liquid injection and complete vaporization. Faster vaporization may reduce a length of piping downstream from vaporization point 1303. In one scenario, a liquid injector may be mounted directly to mixing vessel 1304. In another scenario, a liquid injector may be mounted directly to showerhead 1306.

In some embodiments, a liquid flow controller upstream of vaporization point 1303 may be provided for controlling a mass flow of liquid for vaporization and delivery to process station 1300. For example, the liquid flow controller (LFC) may include a thermal mass flow meter (MFM) located downstream of the LFC. A plunger valve of the LFC may then be adjusted responsive to feedback control signals provided by a proportional-integral-derivative (PID) controller in electrical communication with the MFM. However, it may take one second or more to stabilize liquid flow using feedback control. This may extend a time for dosing a liquid reactant. Thus, in some embodiments, the LFC may be dynamically switched between a feedback control mode and a direct control mode. In some embodiments, the LFC may be dynamically switched from a feedback control mode to a direct control mode by disabling a sense tube of the LFC and the PID controller.

Showerhead 1306 distributes process gases toward substrate 1312. In the embodiment shown in FIG. 5A, substrate 1312 is located beneath showerhead 1306, and is shown resting on a pedestal 1308. It will be appreciated that showerhead 1306 may have any suitable shape, and may have any suitable number and arrangement of ports for distributing processes gases to substrate 1312.

In some embodiments, a microvolume 1307 is located beneath showerhead 1306. Performing a CFD process in a microvolume rather than in the entire volume of a process station may reduce reactant exposure and sweep times, may reduce times for altering process conditions (e.g., pressure, temperature, etc.), may limit an exposure of process station robotics to process gases, etc. Example microvolume sizes include, but are not limited to, volumes between 0.1 liter and 2 liters.

In some embodiments, pedestal 1308 may be raised or lowered to expose substrate 1312 to microvolume 1307 and/or to vary a volume of microvolume 1307. For example, in a substrate transfer phase, pedestal 1308 may be lowered to allow substrate 1312 to be loaded onto pedestal 1308. During an ALD/CFD process phase, pedestal 1308 may be raised to position substrate 1312 within microvolume 1307. In some embodiments, microvolume 1307 may completely enclose substrate 1312 as well as a portion of pedestal 1308 to create a region of high flow impedance during an ALD/CFD process.

Optionally, pedestal 1308 may be lowered and/or raised during portions the ALD/CFD process to modulate process pressure, reactant concentration, etc., within microvolume 1307. In one scenario where process chamber body 1302 remains at a base pressure during the process, lowering pedestal 1308 may allow microvolume 1307 to be evacuated. Example ratios of microvolume to process chamber volume include, but are not limited to, volume ratios between 1:500 and 1:10. It will be appreciated that, in some embodiments, pedestal height may be adjusted programmatically by a suitable computer controller.

In another scenario, adjusting a height of pedestal 1308 may allow a plasma density to be varied during plasma activation and/or treatment cycles included in the ALD/CFD process. At the conclusion of the ALD/CFD process phase, pedestal 1308 may be lowered during another substrate transfer phase to allow removal of substrate 1312 from pedestal 1308.

While the example microvolume variations described herein refer to a height-adjustable pedestal, it will be appreciated that, in some embodiments, a position of showerhead 1306 may be adjusted relative to pedestal 1308 to vary a volume of microvolume 1307. Further, it will be appreciated that a vertical position of pedestal 1308 and/or showerhead 1306 may be varied by any suitable mechanism within the scope of the present disclosure. In some embodiments, pedestal 1308 may include a rotational axis for rotating an orientation of substrate 1312. It will be appreciated that, in some embodiments, one or more of these example adjustments may be performed programmatically by one or more suitable computer controllers.

Returning to the embodiment shown in FIG. 5A, showerhead 1306 and pedestal 1308 electrically communicate with RF power supply 1314 and matching network 1316 for powering a plasma. In some embodiments, the plasma energy may be controlled by controlling one or more of a process station pressure, a gas concentration, an RF source power, an RF source frequency, and a plasma power pulse timing. For example, RF power supply 1314 and matching network 1316 may be operated at any suitable power to form a plasma having a desired composition of radical species. Examples of suitable powers are included above. Likewise, RF power supply 1314 may provide RF power of any suitable frequency. In some embodiments, RF power supply 1314 may be configured to control high- and low-frequency RF power sources independently of one another. Example low-frequency RF frequencies may include, but are not limited to, frequencies between 50 kHz and 500 kHz. Example high-frequency RF frequencies may include, but are not limited to, frequencies between 1.8 MHz and 2.45 GHz. It will be appreciated that any suitable parameters may be modulated discretely or continuously to provide plasma energy for the surface reactions. In one non-limiting example, the plasma power may be intermittently pulsed to reduce ion bombardment with the substrate surface relative to continuously powered plasmas.

In some embodiments, the plasma may be monitored in-situ by one or more plasma monitors. In one scenario, plasma power may be monitored by one or more voltage, current sensors (e.g., VI probes). In another scenario, plasma density and/or process gas concentration may be measured by one or more optical emission spectroscopy sensors (OES). In some embodiments, one or more plasma parameters may be programmatically adjusted based on measurements from such in-situ plasma monitors. For example, an OES sensor may be used in a feedback loop for providing programmatic control of plasma power. It will be appreciated that, in some embodiments, other monitors may be used to monitor the plasma and other process characteristics. Such monitors may include, but are not limited to, infrared (IR) monitors, acoustic monitors, and pressure transducers.

In some embodiments, the plasma may be controlled via input/output control (IOC) sequencing instructions. In one example, the instructions for setting plasma conditions for a plasma activation phase may be included in a corresponding plasma activation recipe phase of a process recipe. In some cases, process recipe phases may be sequentially arranged, so that all instructions for a process phase are executed concurrently with that process phase. In some embodiments, instructions for setting one or more plasma parameters may be included in a recipe phase preceding a plasma process phase. For example, a first recipe phase may include instructions for setting a flow rate of an inert and/or a reactant gas, instructions for setting a plasma generator to a power set point, and time delay instructions for the first recipe phase. A second, subsequent recipe phase may include instructions for enabling the plasma generator and time delay instructions for the second recipe phase. A third recipe phase may include instructions for disabling the plasma generator and time delay instructions for the third recipe phase. It will be appreciated that these recipe phases may be further subdivided and/or iterated in any suitable way within the scope of the present disclosure.

In some deposition processes, plasma strikes last on the order of a few seconds or more in duration. In certain implementations described herein, much shorter plasma strikes may be applied during a processing cycle. These may be on the order of 50 ms to 1 second, with 0.25 seconds being a specific example. Such short RF plasma strikes require quick stabilization of the plasma. To accomplish this, the plasma generator may be configured such that the impedance match is preset to a particular voltage, while the frequency is allowed to float. Conventionally, high-frequency plasmas are generated at an RF frequency at about 13.56 MHz. In various embodiments disclosed herein, the frequency is allowed to float to a value that is different from this standard value. By permitting the frequency to float while fixing the impedance match to a predetermined voltage, the plasma can stabilize much more quickly, a result which may be important when using the very short plasma strikes associated with ALD/CFD cycles.

In some embodiments, pedestal 1308 may be temperature controlled via heater 1310. Further, in some embodiments, pressure control for process station 1300 may be provided by butterfly valve 1318. As shown in the embodiment of FIG. 5A, butterfly valve 1318 throttles a vacuum provided by a downstream vacuum pump (not shown). However, in some embodiments, pressure control of process station 1300 may also be adjusted by varying a flow rate of one or more gases introduced to process station 1300.

The internal surfaces of the process station 1300 are coated with undercoat 1350. Examples of surfaces that become coated with undercoat include the chamber walls 1302, the chamber ceiling and floor, the pedestal 1308 and the showerhead 1306. Although FIG. 5A is shown with a substrate 1312 in the process station 1300, this substrate 1312 is not present during deposition of an undercoat. Instead, the substrate 1312 is introduced to the process station 1300 after the undercoat is deposited, when the process station 1300 is ready to be used for depositing film on the substrate 1312.

Figure 5B:
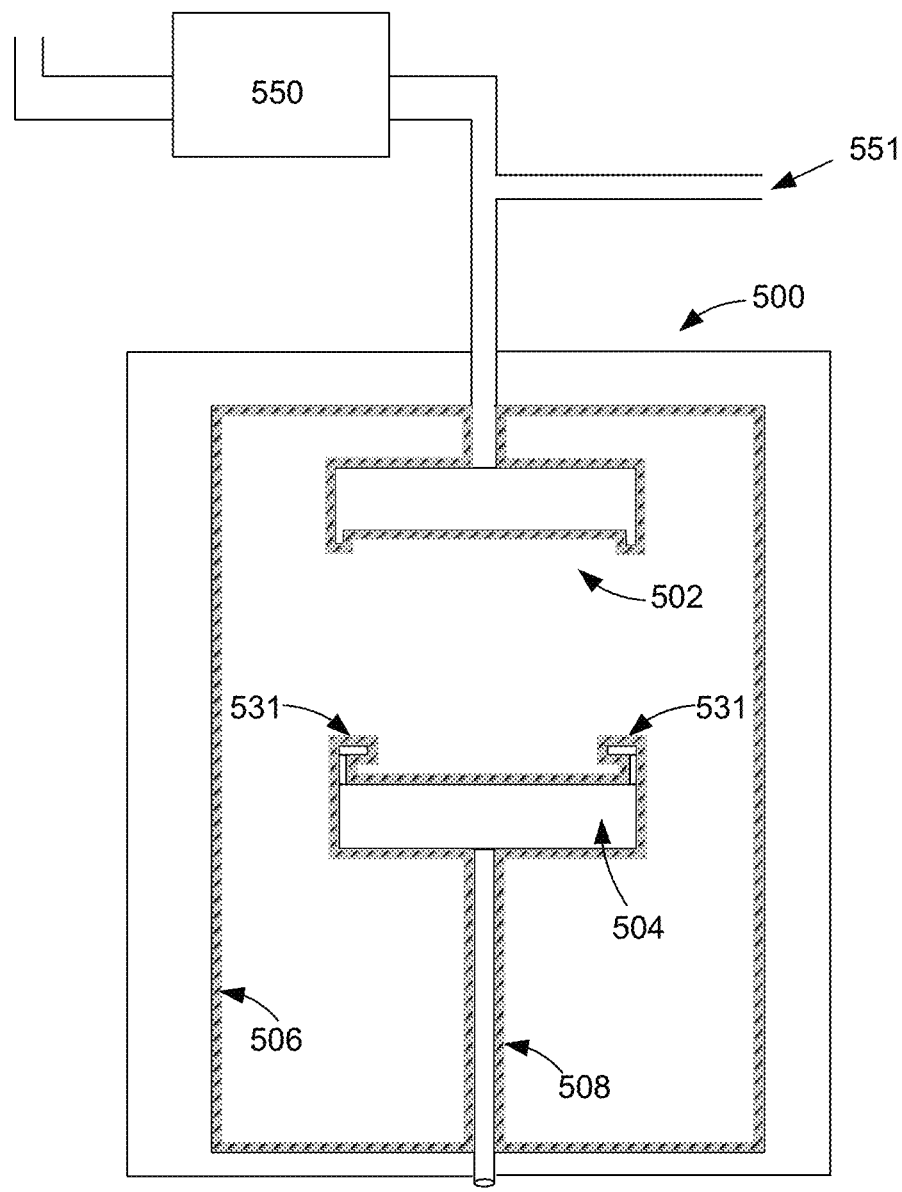

FIG. 5B shows another view of a reaction chamber 500. When used to deposit films on substrates, the substrate (not shown) is positioned on the substrate carrier ring 531, which is supported by pedestal 504 (also referred to as a substrate support), which is supported by support pillar 508. Process gases are provided to the reaction chamber through inlet 551. In this embodiment, a remote plasma generator 550 may be used to generate plasma. After passing through inlet 551, reactants and other process gases enter the reaction chamber through showerhead 502. The interior surfaces of the reaction chamber (including at least the showerhead 502, support 508, pedestal 504, substrate carrier ring 531, and the walls, floor and ceiling of the reaction chamber 500) are coated with undercoat 506. The thickness of undercoat 506 has been exaggerated for the purpose of illustration. In some embodiments, some of the interior surfaces (e.g., the substrate carrier ring) may be made from a non-metallic material such as ceramic, or may have intricate geometries. Where CVD-based methods are used to coat a chamber, these non-metallic and intricate geometry parts often do not receive a uniform coating of undercoat. For example, the undercoat may not completely coat certain areas, or may coat too thick in other areas. With certain embodiments of the disclosed ALD-based undercoat formation methods, even these non-metallic and intricate parts receive a uniform, conformal undercoat. The uniform undercoat provides superior resistance to flaking compared to a CVD-based undercoat, especially on the non-metallic parts such as the substrate carrier ring. In some embodiments, a carrier ring is moveable between up and down positions. In some embodiments, an undercoat deposition may be performed with the carrier ring in an up position such that all surfaces are accessible for deposition.

As described above, one or more process stations may be included in a multi-station processing tool. FIG. 6 shows a schematic view of an embodiment of a multi-station processing tool 2400 with an inbound load lock 2402 and an outbound load lock 2404, either or both of which may comprise a remote plasma source. A robot 2406, at atmospheric pressure, is configured to move wafers from a cassette loaded through a pod 2408 into inbound load lock 2402 via an atmospheric port 2410. A wafer is placed by the robot 2406 on a pedestal 2412 in the inbound load lock 2402, the atmospheric port 2410 is closed, and the load lock is pumped down. Where the inbound load lock 2402 comprises a remote plasma source, the wafer may be exposed to a remote plasma treatment in the load lock prior to being introduced into a processing chamber 2414. Further, the wafer also may be heated in the inbound load lock 2402 as well, for example, to remove moisture and adsorbed gases. Next, a chamber transport port 2416 to processing chamber 2414 is opened, and another robot (not shown) places the wafer into the reactor on a pedestal of a first station shown in the reactor for processing. While the embodiment depicted in FIG. 6 includes load locks, it will be appreciated that, in some embodiments, direct entry of a wafer into a process station may be provided.

The depicted processing chamber 2414 comprises four process stations, numbered from 1 to 4 in the embodiment shown in FIG. 6. Each station has a heated pedestal (shown at 2418 for station 1), and gas line inlets. It will be appreciated that in some embodiments, each process station may have different or multiple purposes. For example, in some embodiments, a process station may be switchable between an ALD mode, a CFD mode, and a CVD process mode. Additionally or alternatively, in some embodiments, processing chamber 2414 may include one or more matched pairs of ALD/CFD/CVD process stations. While the depicted processing chamber 2414 comprises four stations, it will be understood that a processing chamber according to the present disclosure may have any suitable number of stations. For example, in some embodiments, a processing chamber may have five or more stations, while in other embodiments a processing chamber may have three or fewer stations.

FIG. 6 also depicts an embodiment of a wafer handling system 2490 for transferring wafers within processing chamber 2414. In some embodiments, wafer handling system 2490 may transfer wafers between various process stations and/or between a process station and a load lock. It will be appreciated that any suitable wafer handling system may be employed. Non-limiting examples include wafer carousels and wafer handling robots. FIG. 6 also depicts an embodiment of a system controller 2450 employed to control process conditions and hardware states of process tool 2400. System controller 2450 may include one or more memory devices 2456, one or more mass storage devices 2454, and one or more processors 2452. Processor 2452 may include a CPU or computer, analog and/or digital input/output connections, stepper motor controller boards, etc.

In some embodiments, system controller 2450 controls all of the activities of process tool 2400. System controller 2450 executes system control software 2458 stored in mass storage device 2454, loaded into memory device 2456, and executed on processor 2452. System control software 2458 may include instructions for controlling the timing, mixture of gases, chamber and/or station pressure, chamber and/or station temperature, wafer temperature, target power levels, RF power levels, RF exposure time, substrate pedestal, chuck and/or susceptor position, and other parameters of a particular process performed by process tool 2400. These programmed processes may include various types of processes including, but not limited to, processes related to deposition of an undercoat, processes related to deposition of film on substrates, and processes related to cleaning the chamber. System control software 2458 may be configured in any suitable way. For example, various process tool component subroutines or control objects may be written to control operation of the process tool components necessary to carry out various process tool processes. System control software 2458 may be coded in any suitable computer readable programming language.

In some embodiments, system control software 2458 may include input/output control (IOC) sequencing instructions for controlling the various parameters described above. For example, each phase of an ALD undercoat deposition process may include one or more instructions for execution by system controller 2450. The instructions for setting process conditions for an ALD/CFD undercoat deposition process phase may be included in a corresponding ALD/CFD undercoat deposition recipe phase. In some embodiments, the recipe phases may be sequentially arranged, so that all instructions for a process phase are executed concurrently with that process phase.

Other computer software and/or programs stored on mass storage device 2454 and/or memory device 2456 associated with system controller 2450 may be employed in some embodiments. Examples of programs or sections of programs for this purpose include a substrate positioning program, a process gas control program, a pressure control program, a heater control program, and a plasma control program.

A substrate positioning program may include program code for process tool components that are used to load the substrate onto pedestal 2418 and to control the spacing between the substrate and other parts of process tool 2400. The positioning program may include instructions for appropriately moving substrates in and out of the reaction chamber as necessary to form an undercoat, deposit films on substrates, and clean the chamber. These may include instructions for ensuring that no substrates are present in the reaction chamber during deposition of the ALD/CFD-based undercoat and during the cleaning process.

A process gas control program may include code for controlling gas composition and flow rates and optionally for flowing gas into one or more process stations prior to deposition in order to stabilize the pressure in the process station. In some embodiments, the process gas control program includes instructions for introducing certain gases during formation of an undercoat on the reaction chamber, and for introducing the same gases during formation of a film on a substrate in the reaction chamber. The process gas control program may also include instructions to deliver these gases at the same rates, for the same durations, during formation of the undercoat and during deposition of film on substrates.

A pressure control program may include code for controlling the pressure in the process station by regulating, for example, a throttle valve in the exhaust system of the process station, a gas flow into the process station, etc. The pressure control program may include instructions for maintaining the same pressure during deposition of the undercoat on the reaction chamber as during the deposition of film on substrates.

A heater control program may include code for controlling the current to a heating unit that is used to heat the substrate. Alternatively, the heater control program may control delivery of a heat transfer gas (such as helium) to the substrate. The heater control program may include code for maintaining the same temperature in the reaction chamber and/or substrate holder during deposition of the undercoat and during deposition of film on substrates.

A plasma control program may include code for setting RF power levels, frequencies, and exposure times in one or more process stations in accordance with the embodiments herein. In some embodiments, the plasma control program may include instructions for using the same RF power levels and/or frequencies and/or exposure times during deposition of the undercoat on the reaction chamber and during deposition of film on substrates.

In some embodiments, there may be a user interface associated with system controller 2450. The user interface may include a display screen, graphical software displays of the apparatus and/or process conditions, and user input devices such as pointing devices, keyboards, touch screens, microphones, etc.

In some embodiments, parameters adjusted by system controller 2450 may relate to process conditions. Non-limiting examples include process gas composition and flow rates, temperature, pressure, plasma conditions (such as RF bias power levels and exposure times), etc. These parameters may be provided to the user in the form of a recipe, which may be entered utilizing the user interface.

Signals for monitoring the process may be provided by analog and/or digital input connections of system controller 2450 from various process tool sensors. The signals for controlling the process may be output on the analog and digital output connections of process tool 2400. Non-limiting examples of process tool sensors that may be monitored include mass flow controllers, pressure sensors (such as manometers), thermocouples, etc. Appropriately programmed feedback and control algorithms may be used with data from these sensors to maintain process conditions.

System controller 2450 may provide program instructions for implementing the above-described deposition processes. The program instructions may control a variety of process parameters, such as DC power level, RF bias power level, pressure, temperature, etc. The instructions may control the parameters to operate in-situ deposition of film stacks according to various embodiments described herein.

The system controller will typically include one or more memory devices and one or more processors configured to execute the instructions so that the apparatus will perform a method in accordance with the present invention. Machine-readable, non-transitory media containing instructions for controlling process operations in accordance with the present invention may be coupled to the system controller.

The various hardware and method embodiments described above may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility.

Lithographic patterning of a film typically comprises some or all of the following steps, each step enabled with a number of possible tools: (1) application of photoresist on a workpiece, e.g., a substrate having a silicon nitride film formed thereon, using a spin-on or spray-on tool; (2) curing of photoresist using a hot plate or furnace or other suitable curing tool; (3) exposing the photoresist to visible or UV or x-ray light with a tool such as a wafer stepper; (4) developing the resist so as to selectively remove resist and thereby pattern it using a tool such as a wet bench or a spray developer; (5) transferring the resist pattern into an underlying film or workpiece by using a dry or plasma-assisted etching tool; and (6) removing the resist using a tool such as an RF or microwave plasma resist stripper. In some embodiments, an ashable hard mask layer (such as an amorphous carbon layer) and another suitable hard mask (such as an antireflective layer) may be deposited prior to applying the photoresist.

It is to be understood that the configurations and/or approaches described herein are exemplary in nature, and that these specific embodiments or examples are not to be considered in a limiting sense, because numerous variations are possible. The specific routines or methods described herein may represent one or more of any number of processing strategies. As such, various acts illustrated may be performed in the sequence illustrated, in other sequences, in parallel, or in some cases omitted. Likewise, the order of the above described processes may be changed.

The subject matter of the present disclosure includes all novel and nonobvious combinations and sub-combinations of the various processes, systems and configurations, and other features, functions, acts, and/or properties disclosed herein, as well as any and all equivalents thereof.

Experimental

Experimental testing has shown that thin ALD-based undercoats are able to minimize metal contamination with performance comparable to much thicker CVD-based undercoats. Further, the ALD-based undercoats resist flaking much better than the CVD-based undercoats, allowing an increased number of substrates to be processed in the reaction chamber between subsequent chamber cleaning operations, thereby increasing throughput. Although the ALD-based undercoats take longer to deposit than CVD-based undercoats, this longer undercoat deposition time is outweighed in certain embodiments by certain throughput-related advantages of the ALD-based undercoats (e.g., increased number of substrates between cleaning operations, no need to wait for chamber to cool down, no need to flush CVD reactants from chamber multiple times, and/or no need to perform a precoating operation).

FIG. 7 shows a table relating the concentration of various metals on the surface of a substrate after different deposition processes. In each case, a layer of ALD-based silicon oxide was deposited on a substrate to a thickness of about 250 Å. In the case shown in column A, the film was deposited on a substrate in a clean chamber having no undercoat. The concentration of aluminum detected in the film deposited in a chamber lacking an undercoat was fairly high at $0.24 \times 10^{10}$ atoms/cm$^2$. Copper and iron were also present in detectable amounts. In the case shown in column D, the oxide film was deposited on a substrate having a CVD-based undoped silicate glass undercoat having a thickness of about 1 μm.

Columns B and C of FIG. 7 relate to films deposited in reaction chambers having ALD-based undercoats as described herein. In column B, the ALD-based undercoat was deposited to a thickness of about 1000 Å (0.1 μm, ten times thinner than the CVD-based undercoat represented in column D), and in column C the ALD-based undercoat was deposited to a thickness of about 2000 Å (0.2 μm, five times thinner than the CVD-based undercoat). Both films showed very low amounts of metal contamination. Neither film showed a detectable amount of aluminum or iron. The concentration of copper was reduced compared to the no undercoat case of column A, and was nearly as low as the CVD-based undercoat case of column D. The 2000 Å thick ALD-based undercoat of column C showed somewhat lower metal contamination than the 1000 Å thick ALD-based undercoat of column B.

The results of FIG. 7 suggest that the thin ALD-based undercoats can perform as well as the much thicker CVD-based undercoats in terms of preventing metal contamination.

FIG. 8 is a table showing the number of particles of different sizes that were detected on films deposited in a reaction chamber having a 2000 Å thick ALD-based silicon oxide undercoat, and in a reaction chamber having a 2 μm thick CVD-based USG undercoat. In each case, the film deposited on the substrate was a 250 Å thick silicon oxide film. The ALD-based undercoat was deposited under the following conditions: chamber pressure of 1.8 Torr, 0.2 second dose of BTBAS flowing between about 1-2 mL/min, followed by a 0.3 second purge, followed by a 0.25 second application of plasma at an RF power between about 500-2500 W/station while providing a dose of $O_2$ and $N_2O$ co-flowing at about 10 SLM each, followed by a post-RF purge lasting about 0.15 second. When considering larger particles (e.g., particles larger than about 0.12 μm), both films showed very good (i.e., low) levels of particle formation. When considering smaller particles (e.g., particles greater than about 0.05 μm), the film deposited with a CVD-based undercoat showed somewhat better particle performance. Although the ALD-based film showed higher particle formation at small particle sizes, the results were still within acceptable levels.

FIG. 9 is a table similar to FIG. 8, but compares films deposited in reaction chambers having undercoats deposited according to two different ALD-based methods. In each case, the film on the substrate was silicon oxide deposited at about 50° C. to a thickness of about 250 Å. The undercoat in each case was deposited to a thickness of about 2000 Å. In Process A, the undercoat was deposited at an RF power level of about 200 W/station, while in Process B, the undercoat was deposited at an RF power level of about 125 W/station.

Both the films shown in FIG. 9 show good particle performance. At particle sizes greater than about 0.05 μm, the particle performance was excellent for both cases, showing lower levels of particle formation than the film deposited in a chamber having a CVD-based undercoat as shown in FIG. 8. These results suggest that thin ALD-based undercoats can result in a resistance to particle formation that is as good or better than thicker CVD-based undercoats.

FIGS. 10A and 10B show particle maps for the films described in relation to Process A and Process B of FIG. 9, respectively. The particle maps show the location of particles detected on the substrate surface. Only particles that are larger than 0.04 μm are shown.

FIG. 11 is a table showing wafer-to-wafer repeatability/uniformity for films deposited in a reaction chamber having an ALD-based undercoat. In this case, the silicon oxide undercoat was deposited to a thickness of about 2000 Å. The films were deposited on substrates to a thickness of about 260 Å, at a temperature of about 50° C. A total of 25 substrates were processed and tested. The wafer count refers to the order in which the substrates were processed. For example, wafer count 1 is the first substrate that was processed after deposition of the undercoat, and wafer count 25 was the last substrate that was processed. The thickness reported corresponds to the thickness of the particular film deposited. The range corresponds to the difference between the thickest part of the film and the thinnest part of the film. The % NU (1-sigma) and Range % (half range) relate to the degree of non-uniformity in the film as calculated by different standard methods. Overall, the films showed a wafer-to-wafer non-uniformity (half range) of 0.16%. The results in FIG. 11 show that the use of an ALD-based undercoat can result in excellent wafer-to-wafer repeatability.

Figures 12, 13:
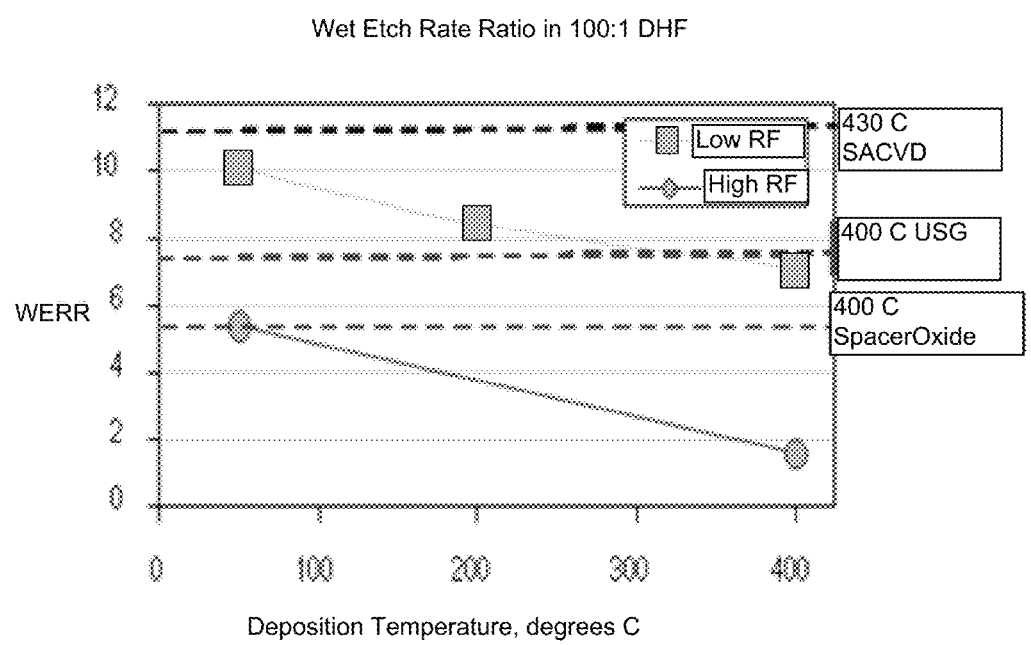
FIG. 12 is a table comparing chamber performance and throughput for reaction chambers having CVD- and ALD-based undercoats.
FIG. 13 shows a graph depicting wet etch rate vs. deposition temperature for different levels of RF flux.

FIG. 12 is a table comparing the performance of a 2 μm thick CVD-based undercoat to that of a 2000 Å (0.2 μm thick) ALD-based undercoat. The ALD-based undercoat was able to achieve a chamber total accumulation limit of 5 μm compared to only 3.7 μm for the CVD-based undercoat. In other words, substantially more film was deposited on the ALD-based undercoat than on the CVD-based undercoat before film flaking was apparent. While the accumulation limit is only about 35% higher in the ALD-based undercoat case, much of the accumulation contributing to the accumulation limit in the CVD-based undercoat case is deposited during formation of the thick CVD-based undercoat. In other words, while the accumulation limit increases by about 35%, the number of substrates that may be processed between subsequent cleaning cycles increases by over 200%. The ALD-based undercoat was able to process about 770 substrates while the CVD-based undercoat was only able to process about 250 substrates. Due to the $N_2O$ plasma heating effects described above, twenty dummy wafers were processed in the chamber having the CVD-based undercoat before the chamber was used to deposit on valuable substrates. This dummy wafer deposition was done to help lower the temperature of the reaction chamber to its desired, stable value. Overall, the ALD-based undercoat resulted in an increased throughput compared to the CVD-based undercoat.

Figure 14:
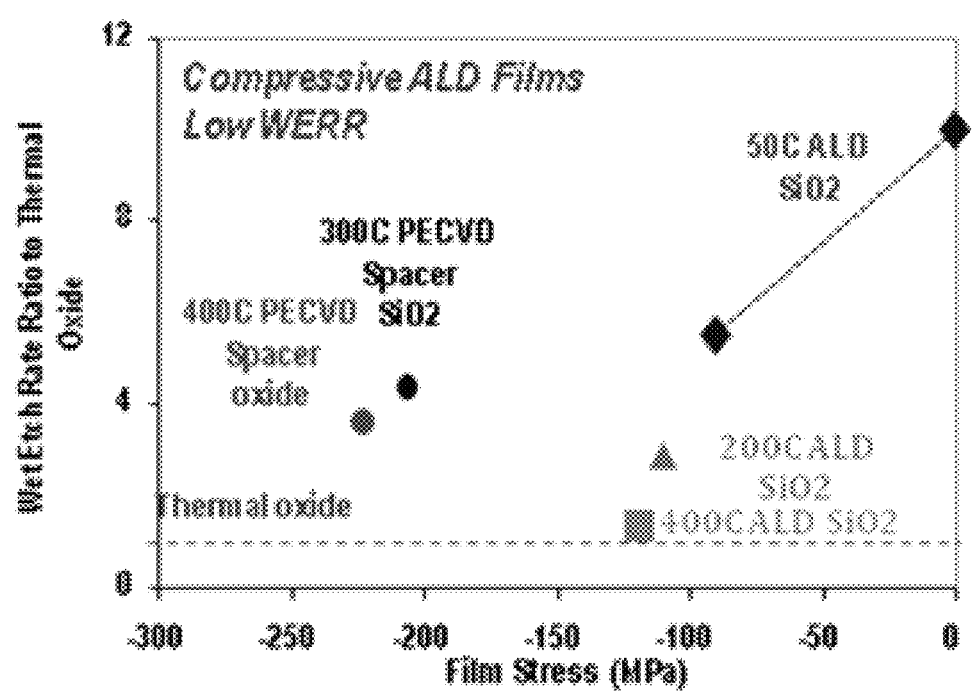
FIG. 14 shows a graph of wet etch rate vs. film stress for various films.

In some embodiments, an undercoat may be formed at different plasma characteristics (e.g., RF power, RF time and/or RF frequency) as compared to those used during deposition of film on substrates after the undercoat is deposited. For instance, lower levels of RF flux may be used to deposit films (e.g., undercoats and/or film on substrates) having higher wet etch rates. FIG. 13 is a graph showing the wet etch rate ratio (WERR) to thermal oxide in 100:1 water:HF vs. the deposition temperature for low RF and high RF cases. As shown in FIG. 13, the film deposited at lower RF flux showed a higher wet etch rate. One reason that a higher wet etch rate may be desired is that it may correspond to a less compressive, more neutral stress within the film. FIG. 14 shows a graph depicting the wet etch rate ratio to thermal oxide vs. film stress. As shown, an ALD-based $SiO_2$ film with a higher wet etch rate ratio has a substantially neutral stress, while an ALD-based $SiO_2$ film with a lower wet etch rate ratio has a more compressive stress. RF flux may be decreased by using a lower RF power and/or a shorter RF time. Additionally, in certain embodiments a higher level of RF flux may be used to deposit a film (e.g., undercoat and/or film on a substrate) that has a lower wet etch rate and more compressive stress level, which may be desirable in certain applications.

In some implementations, the undercoat on the reaction chamber may be deposited at a lower RF flux (RF power and/or RF time) than that used during deposition of film on substrates in the reaction chamber. In other implementations, the undercoat on the reaction chamber may be deposited at a higher RF flux than that used during deposition of film on substrates in the reaction chamber.

Similarly, the RF flux may be changed during deposition of an undercoat to gradually change the wet etch rate and stress of the undercoat as it is deposited. For example, an RF flux may be decreased during deposition of the undercoat to gradually increase the wet etch rate and decrease the stress of the undercoat. This gradual decrease in stress may help prevent film flaking and peeling, thereby allowing the chamber to reach a higher chamber accumulation limit between cleaning operations.

Moreover, the deposition temperature may change between deposition of an undercoat and deposition of films on substrates, or during deposition of the undercoat. Returning to FIG. 13, lower deposition temperatures result in higher wet etch rate ratios and correspondingly more neutral films. Conversely, higher deposition temperatures result in lower wet etch rates and ratios, and more compressive films. In some embodiments, the undercoat is deposited in a chamber at a higher temperature than the films deposited on substrates in the chamber. In other embodiments, the undercoat may be deposited at lower temperatures than the films deposited on substrates in the chamber. In yet other embodiments, the undercoat is deposited at the same temperature as the films deposited on substrates in the reaction chamber. Also, as mentioned, the temperature may change during deposition of the undercoat. For instance, the temperature may decrease during deposition of the undercoat to form an undercoat that becomes gradually more neutral. Conversely, the temperature may increase during deposition of the undercoat to form an undercoat that becomes gradually more compressive. These gradual changes may help prevent flaking and peeling, and may help the chamber reach a higher chamber accumulation limit between cleaning processes.

What is claimed is:

1. A method of forming an undercoat on interior surfaces of a reaction chamber for processing substrates, comprising:
    (a) introducing a flow of a first reactant in vapor phase into the reaction chamber and allowing the first reactant to adsorb onto the interior surfaces of the reaction chamber;
    (b) introducing a flow of a second reactant in vapor phase into the reaction chamber while the first reactant is adsorbed on the interior surfaces of the reaction chamber;
    (c) exposing the reaction chamber to plasma when the flow of at least one of the first and second reactants has ceased, in order to drive a reaction between the first and second reactants on the interior surfaces of the reaction chamber to form the undercoat, wherein the undercoat conformally coats the interior surfaces of the reaction chamber;
    (d) receiving a substrate in the reaction chamber;
    (e) introducing a flow of a third reactant in vapor phase into the reaction chamber and allowing the third reactant to adsorb onto the surface of the substrate;

(f) introducing a flow of a fourth reactant in vapor phase into the reaction chamber while the third reactant is adsorbed on the surface of the substrate; and (g) exposing the reaction chamber to plasma when the flow of at least one of the third and fourth reactants has ceased, in order to drive a reaction between the third and fourth reactants to form a second film on the surface of the substrate, wherein operations (a)-(c) occur when there is no substrate present in the reaction chamber, wherein operations (a)-(c) are repeated until the undercoat is at least about 0.1 μm thick, and wherein the first reactant and second reactant are the same as the third reactant and fourth reactant, respectively.

2. The method of claim 1, wherein the temperature in the reaction chamber does not vary by more than about 2° C. during operations (a)-(c).

3. The method of claim 2, wherein the undercoat is an oxide, nitride, a carbide, or a carbonitride.

4. The method of claim 3, wherein the second reactant comprises $O_2$ and $N_2O$.

5. The method of claim 2, wherein the undercoat is a noble metal, a lanthanide oxide, a group 4 metal oxide, or a group 5 metal oxide.

6. The method of claim 1, wherein the undercoat conformally coats a substrate carrier.

7. The method of claim 6, wherein the undercoat is no more than about 0.2 μm thick.

8. The method of claim 1, wherein the undercoat is no more than about 0.5 μm thick.

9. The method of claim 1, wherein the second and fourth reactants each comprise $O_2$ and $N_2O$.

10. The method of claim 1, wherein reaction chamber pressure, reaction chamber temperature, dosing durations, plasma exposure durations, and RF power values remain substantially constant between operations (a)-(c) and operations (e)-(g).

11. The method of claim 1, wherein the temperature in the reaction chamber does not vary by more than about 2° C. during operations (a)-(g).

12. The method of claim 11, wherein operation (e) begins within about 5 minutes after a last iteration of operation (c).

13. The method of claim 1, wherein the reaction chamber is not purged between a last iteration of operation (c) and a first iteration of operation (e).

14. The method of claim 1, wherein operations (d)-(g) are repeated with a plurality of substrates, and wherein film deposited on the interior surfaces of the reaction chamber during operations (a)-(g) does not begin to flake or peel off until a total of at least about 7.5 μm of the second film has been deposited on the substrates.

15. The method of claim 1, wherein operations (d)-(g) are repeated with a plurality of substrates, and wherein film deposited in operations (a)-(g) does not begin to flake or peel off until at least about 300 substrates have been processed through the reaction chamber using operations (d)-(g).

16. The method of claim 1, wherein a first iteration of operations (a)-(c) are performed at a first level of RF flux and a second iteration of operations (a)-(c) are performed at a second level of RF flux, where the first and second levels of RF flux are different.

* * * * *